(12) United States Patent
Lee et al.

(10) Patent No.: US 12,439,818 B2
(45) Date of Patent: Oct. 7, 2025

(54) COMPOUND FOR ORGANIC ELECTRONIC ELEMENT, ORGANIC ELECTRONIC ELEMENT USING THE SAME, AND AN ELECTRONIC DEVICE THEREOF

(71) Applicant: DUK SAN NEOLUX CO., LTD., Cheonan-si (KR)

(72) Inventors: Yun Suk Lee, Cheonan-si (KR); Nam Geol Lee, Cheonan-si (KR); Jae Wan Jang, Cheonan-si (KR); Jae Duk Yoo, Cheonan-si (KR); Soung Yun Mun, Cheonan-si (KR); Jong Gwang Park, Cheonan-si (KR); In Goo Lee, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 803 days.

(21) Appl. No.: 17/452,303

(22) Filed: Oct. 26, 2021

(65) Prior Publication Data
US 2022/0131082 A1    Apr. 28, 2022

(30) Foreign Application Priority Data

Oct. 26, 2020   (KR) ........................ 10-2020-0139441
Mar. 17, 2021   (KR) ........................ 10-2021-0034510

(51) Int. Cl.
*H10K 85/60* (2023.01)
*C07D 251/24* (2006.01)
(Continued)

(52) U.S. Cl.
CPC ......... *H10K 85/636* (2023.02); *C07D 251/24* (2013.01); *C09K 11/06* (2013.01);
(Continued)

(58) Field of Classification Search
CPC ............ H10K 85/6574; H10K 85/626; H10K 85/631; H10K 85/653; H10K 85/654; H10K 85/6572; H10K 85/6576; H10K 50/11; H10K 50/15; H10K 50/16; H10K 50/18; H10K 2101/10; H10K 2101/90; H10K 85/636; H10K 85/615; H10K 50/19; C07D 251/24; C09K 11/06; C09K 2211/1018;
(Continued)

(56) References Cited

U.S. PATENT DOCUMENTS 9,115,119 B2    8/2015    Wong et al.

FOREIGN PATENT DOCUMENTS

CN    102593374 A        7/2012
JP    2004022334 A  *    1/2004
(Continued)

OTHER PUBLICATIONS

Machine translation JP 2004-022334 A (publication date Jan. 2004). (Year: 2004).*

(Continued)

*Primary Examiner* — Dawn L Garrett
(74) *Attorney, Agent, or Firm* — Vorys, Sater, Seymour and Pease LLP; Mih Suhn Koh

(57) ABSTRACT

The present invention provides a novel compound capable of improving the luminous efficiency, stability and lifespan of an element, an organic electronic element using the same, and an electronic device thereof.

14 Claims, 2 Drawing Sheets

(51) Int. Cl.
*C09K 11/06* (2006.01)
*H10K 50/11* (2023.01)
*H10K 50/15* (2023.01)
*H10K 50/16* (2023.01)
*H10K 101/00* (2023.01)
*H10K 101/10* (2023.01)

(52) U.S. Cl.
CPC ......... *H10K 85/626* (2023.02); *H10K 85/631* (2023.02); *H10K 85/653* (2023.02); *H10K 85/654* (2023.02); *H10K 85/6572* (2023.02); *H10K 85/6574* (2023.02); *H10K 85/6576* (2023.02); *C07B 2200/05* (2013.01); *C09K 2211/1018* (2013.01); *H10K 50/11* (2023.02); *H10K 50/15* (2023.02); *H10K 50/16* (2023.02); *H10K 2101/10* (2023.02); *H10K 2101/90* (2023.02)

(58) Field of Classification Search
CPC .... C09K 2211/1007; C09K 2211/1011; C09K 2211/1059; C07B 2200/05; Y02E 10/549
See application file for complete search history.

(56) References Cited

FOREIGN PATENT DOCUMENTS

| | | | |
|---|---|---|---|
| JP | 2017-69385 A | 4/2017 | |
| JP | 2019-512499 A | 5/2019 | |
| KR | 10-2020-0014189 A | 2/2020 | |
| KR | 10-2020-0077371 A | 6/2020 | |
| WO | WO-2012087961 A2 * | 6/2012 | ........... C07D 209/82 |
| WO | 2020-045981 A | 3/2020 | |
| WO | 2020/045981 A1 | 3/2020 | |

OTHER PUBLICATIONS

Vidya, V. M., Anuj Tripathi, and Chetti Prabhakar. "Linear, non-linear optical properties and reorganization energies of d-π-a star-shaped triazine derivatives: A DFT study." Journal of Molecular Structure 1176 (2019): 855-864. (Year: 2019).*

The Notice of Allowance issued for corresponding KR Patent Application No. 10-2021-0034510, issued on Sep. 3, 2021, four pages total.

The Notice of Grounds for Rejection issued for corresponding KR Patent Application No. 10-2021-0034510, issued on Aug. 9, 2021, six pages total.

* cited by examiner

COMPOUND FOR ORGANIC ELECTRONIC ELEMENT, ORGANIC ELECTRONIC ELEMENT USING THE SAME, AND AN ELECTRONIC DEVICE THEREOF

BACKGROUND

Technical Field

The present invention relates to a compound for an organic electronic element, an organic electronic element using the same, and an electronic device thereof.

Background Art

In general, organic light emitting phenomenon refers to a phenomenon that converts electric energy into light energy by using an organic material. An organic electronic element using an organic light emitting phenomenon usually has a structure including an anode, a cathode, and an organic material layer interposed therebetween. Here, in order to increase the efficiency and stability of the organic electronic element, the organic material layer is often composed of a multi-layered structure composed of different materials, and for example, may include a hole injection layer, a hole transport layer, an emitting layer, an electron transport layer, an electron injection layer and the like.

A material used as an organic material layer in an organic electronic element may be classified into a light emitting material and a charge transport material, such as a hole injection material, a hole transport material, an electron transport material, an electron injection material and the like depending on its function.

Lifespan and efficiency are the most problematic in organic electroluminescent device, and as displays become larger, these problems of efficiency and lifespan must be solved. Efficiency, lifespan, and driving voltage are related to each other, and when the efficiency is increased, the driving voltage is relatively decreased, and as the driving voltage is decreased, crystallization of the organic material due to Joule heating generated during driving decreases, and as a result, the lifespan tends to increase.

However, the efficiency cannot be maximized simply by improving the organic material layer. This is because, when the energy level and T1 value between each organic material layer, and the intrinsic properties of the material (mobility, interfacial properties, etc.) are optimally combined, a long lifespan and high efficiency can be achieved at the same time.

Also, in order to solve the problem of light emission in the hole transport layer in recent organic electroluminescent devices, an emitting-auxiliary layer must exist between the hole transport layer and the emitting layer, and it is time to develop different emitting-auxiliary layers according to each emitting layer (R, G, B).

In general, electrons are transferred from the electron transport layer to the emitting layer, and holes are transferred from the hole transport layer to the emitting layer, and excitons are generated by recombination.

However, since the material used for the hole transport layer should have a low HOMO value, most have a low T1 value. As a result, excitons generated in the emitting layer are transferred to the hole transport layer, resulting in charge unbalance in the emitting layer to emit light at the hole transport layer interface.

When light is emitted at the hole transport layer interface, the color purity and efficiency of the organic electronic element are lowered, and the lifespan is shortened. Therefore, it is urgently required to develop an emitting-auxiliary layer having a high T1 value and having a HOMO level between the HOMO energy level of the hole transport layer and the HOMO energy level of the emitting layer.

Furthermore, it is necessary to develop a hole injection layer material that delays the penetration and diffusion of metal oxides from the anode electrode (ITO) into the organic layer, which is one of the causes of shortening the lifespan of organic electronic element, and that has stable characteristics, that is, a high glass transition temperature, even against Joule heating generated during device driving. The low glass transition temperature of the hole transport layer material has a characteristic of lowering the uniformity of the thin film surface during device driving, which is reported to have a significant effect on device lifespan. Moreover, OLED devices are mainly formed by a deposition method, and it is necessary to develop a material that can withstand a long time during deposition, that is, a material with strong heat resistance.

In other words, in order to fully exhibit the excellent characteristics of an organic electronic element, the material constituting the organic material layer in the device, such as a hole injection material, a hole transport material, a light emitting material, an electron transport material, an electron injection material, emitting auxiliary layer material, etc., is supported by a stable and efficient material. should take precedence, but the development of a stable and efficient organic material layer material for an organic electronic device has not yet been sufficiently made. Therefore, the development of new materials is continuously required.

DETAILED DESCRIPTION OF THE INVENTION

Summary

In order to solve the problems of the above-mentioned background art, the present invention has revealed a compound having a novel structure, and when this compound is applied to an organic electronic element, it has been found that the luminous efficiency, stability and lifespan of the device can be significantly improved.

Accordingly, an object of the present invention is to provide a novel compound, an organic electronic element using the same, and an electronic device thereof.

Technical Solution

The present invention provides a compound represented by Formula (1).

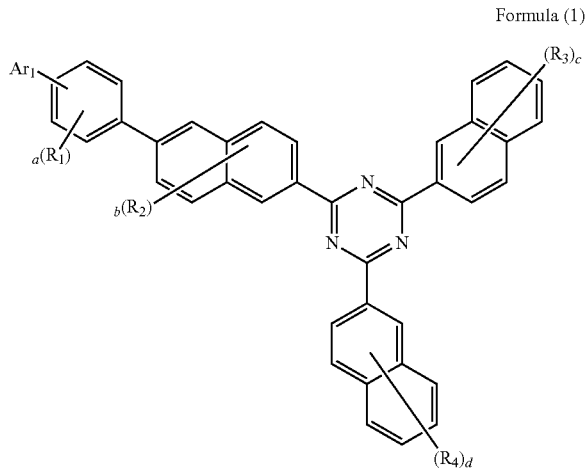

Formula (1)

In another aspect, the present invention provides an organic electronic element comprising the compound represented by Formula (1) and an electronic device thereof.

Effects of the Invention

By using the compound according to the present invention, high luminous efficiency, low driving voltage and high heat resistance of the device can be achieved, and color purity and lifespan of the device can be greatly improved.

Figure 1:
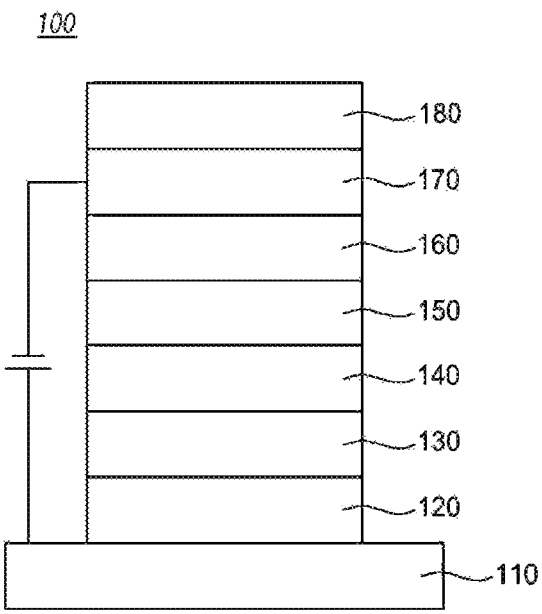
FIG. 1 to FIG. 3 each illustrate an exemplary view of an organic electroluminescent device according to the present invention.

| |
|---|
| 100, 200, 300: organic electronic element |
| 110: the first electrode |
| 120: hole injection layer |
| 130: hole transport layer |
| 140: emitting layer |
| 150: electron transport layer |
| 160: electron injection layer |
| 170: second electrode |
| 180: light efficiency enhancing Layer |
| 210: buffer layer |
| 220: emitting-auxiliary layer |
| 320: first hole injection layer |
| 330: first hole transport layer |
| 340: first emitting layer |
| 350: first electron transport layer |
| 360: first charge generation layer |
| 361: second charge generation layer |
| 420: second hole injection layer |
| 430: second hole transport layer |
| 440: second emitting layer |
| 450: second electron transport layer |
| CGL: charge generation layer |
| ST1 : first stack |
| ST2 : second stack |

DETAILED DESCRIPTION OF THE INVENTION

Hereinafter, some embodiments of the present invention will be described in detail. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if a component is described as being "connected", "coupled", or "connected" to another component, the component may be directly connected or connected to the other component, but another component may be "connected ", "coupled" or "connected" between each component.

As used in the specification and the accompanying claims, unless otherwise stated, the following is the meaning of the term as follows.

Unless otherwise stated, the term "halo" or "halogen", as used herein, includes fluorine, bromine, chlorine, or iodine.

Unless otherwise stated, the term "alkyl" or "alkyl group", as used herein, has a single bond of 1 to 60 carbon atoms, and means saturated aliphatic functional radicals including a linear alkyl group, a branched chain alkyl group, a cycloalkyl group (alicyclic), an cycloalkyl group substituted with a alkyl or an alkyl group substituted with a cycloalkyl.

Unless otherwise stated, the term "alkenyl" or "alkynyl", as used herein, has double or triple bonds of 2 to 60 carbon atoms, but is not limited thereto, and includes a linear or a branched chain group.

Unless otherwise stated, the term "cycloalkyl", as used herein, means alkyl forming a ring having 3 to 60 carbon atoms, but is not limited thereto.

Unless otherwise stated, the term "alkoxyl group", "alkoxy group" or "alkyloxy group", as used herein, means an oxygen radical attached to an alkyl group, but is not limited thereto, and has 1 to 60 carbon atoms.

Unless otherwise stated, the term "aryloxyl group" or "aryloxy group", as used herein, means an oxygen radical attached to an aryl group, but is not limited thereto, and has 6 to 60 carbon atoms.

The terms "aryl group" and "arylene group" used in the present invention have 6 to 60 carbon atoms, respectively, unless otherwise specified, but are not limited thereto. In the present invention, an aryl group or an arylene group means a single ring or multiple ring aromatic, and includes an aromatic ring formed by an adjacent substituent joining or participating in a reaction.

For example, the aryl group may be a phenyl group, a biphenyl group, a fluorene group, or a spirofluorene group.

The prefix "aryl" or "ar" means a radical substituted with an aryl group. For example, an arylalkyl may be an alkyl substituted with an aryl, and an arylalkenyl may be an alkenyl substituted with aryl, and a radical substituted with an aryl has a number of carbon atoms as defined herein.

Also, when prefixes are named subsequently, it means that substituents are listed in the order described first. For example, an arylalkoxy means an alkoxy substituted with an aryl, an alkoxylcarbonyl means a carbonyl substituted with an alkoxyl, and an arylcarbonylalkenyl also means an alkenyl substituted with an arylcarbonyl, wherein the arylcarbonyl may be a carbonyl substituted with an aryl.

Unless otherwise stated, the term "heterocyclic group", as used herein, contains one or more heteroatoms, but is not limited thereto, has 2 to 60 carbon atoms, includes any one of a single ring or multiple ring, and may include heteroaliphadic ring and heteroaromatic ring. Also, the heterocyclic group may also be formed in conjunction with an adjacent group.

Unless otherwise stated, the term "heteroatom", as used herein, represents at least one of N, O, S, P, or Si.

Also, the term "heterocyclic group" may include a ring including $SO_2$ instead of carbon consisting of cycle. For example, "heterocyclic group" includes the following compound.

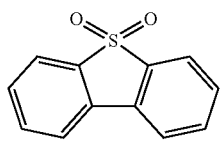 [SMILES: O=S1(=O)c2ccccc2-c2ccccc21]

Unless otherwise stated, the term "fluorenyl group" or "fluorenylene group", as used herein, means a monovalent or divalent functional group, in which R, R' and R" are all hydrogen in the following structures, and the term "substituted fluorenyl group" or "substituted fluorenylene group" means that at least one of the substituents R, R', R" is a substituent other than hydrogen, and include those in which R and R' are bonded to each other to form a spiro compound together with the carbon to which they are bonded.

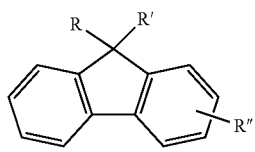

The term "spiro compound", as used herein, has a 'spiro union', and a spiro union means a connection in which two rings share only one atom. At this time, atoms shared in the two rings are called 'spiro atoms', and these compounds are called 'monospiro-', 'di-spiro' and 'tri-spiro', respectively, depending on the number of spiro atoms in a compound.

Unless otherwise stated, the term "aliphatic", as used herein, means an aliphatic hydrocarbon having 1 to 60 carbon atoms, and the term "aliphatic ring", as used herein, means an aliphatic hydrocarbon ring having 3 to 60 carbon atoms.

Unless otherwise stated, the term "ring", as used herein, means an aliphatic ring having 3 to 60 carbon atoms, or an aromatic ring having 6 to 60 carbon atoms, or a hetero ring having 2 to 60 carbon atoms, or a fused ring formed by the combination of them, and includes a saturated or unsaturated ring.

Other hetero compounds or hetero radicals other than the above-mentioned hetero compounds include, but are not limited thereto, one or more heteroatoms.

Also, unless expressly stated, as used herein, "substituted" in the term "substituted or unsubstituted" means substituted with one or more substituents selected from the group consisting of deuterium, halogen, an amino group, a nitrile group, a nitro group, a $C_1$-$C_{20}$ alkyl group, a $C_1$-$C_{20}$ alkoxyl group, a $C_1$-$C_{20}$ alkylamine group, a $C_1$-$C_{20}$ alkylthiopen group, a $C_6$-$C_{20}$ arylthiopen group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted by deuterium, a $C_8$-$C_{20}$ arylalkenyl group, a silane group, a boron group, a germanium group, and a $C_2$-$C_{20}$ heterocyclic group, but is not limited to these substituents.

Also, unless there is an explicit explanation, the formula used in the present invention is the same as the definition of the substituent by the exponent definition of the following formula.

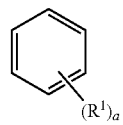

Here, when a is an integer of zero, the substituent $R^1$ is absent, when a is an integer of 1, the sole substituent $R^1$ is linked to any one of the carbon constituting the benzene ring, when a is an integer of 2 or 3, each is combined as follows, where $R^1$ may be the same or different from each other, when a is an integer of 4 to 6, it is bonded to the carbon of the benzene ring in a similar manner, while the indication of the hydrogen bonded to the carbon forming the benzene ring is omitted.

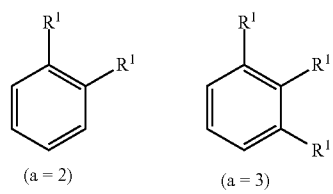

Hereinafter, a compound according to an aspect of the present invention and an organic electronic element including the same will be described.

The present invention provides a compound represented by Formula 1.

Formula 1

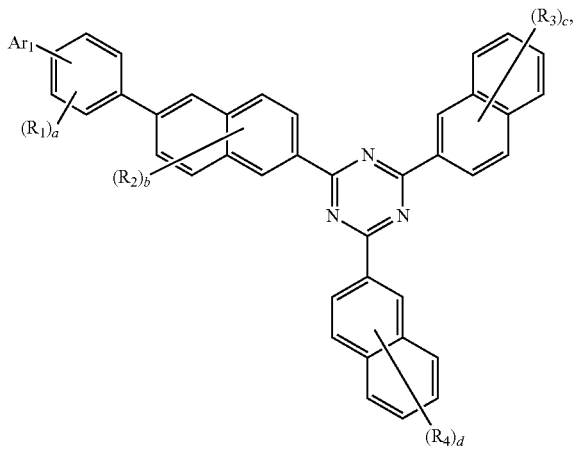

wherein each symbol may be defined as follows.
1) $Ar_1$ is selected from a group consisting of a hydrogen; deuterium; a $C_6$-$C_{12}$ aryl group; and a $C_1$-$C_{10}$ alkyl group;
2) $R_1$ is selected from a group consisting of a hydrogen; deuterium; a $C_6$-$C_{60}$ aryl group; or wherein in case a is 2 or more, $R_1$ is in plural being the same or different, and adjacent groups may be bonded to each other to form a ring.
When $R_1$ is an aryl group, it may be preferably a $C_6$-$C_{30}$ aryl group, and more preferably a $C_6$-$C_{25}$ aryl group, for example, phenylene, biphenyl, naphthalene, terphenyl, and the like.
3) $R_2$, $R_3$ and $R_4$ are an aryl group,
each independently selected from a group consisting of a hydrogen; deuterium; a $C_6$-$C_{60}$ aryl group; when b, c, and d are 2 or more, $R_2$, $R_3$ and $R_4$ are each in plural being the same or different.

When $R_2$, $R_3$ and $R_4$ are aryl groups, they may be preferably a $C_6$-$C_{30}$ aryl group, and more preferably a $C_6$-$C_{25}$ aryl group, for example, phenylene, biphenyl, naphthalene, terphenyl, and the like.

4) a is an integer of 0 to 4, b is an integer of 0 to 6, c and d are each independently an integer from 0 to 7.

Also, the present invention provides a compound having a reorganization energy value of 0.1600 to 0.2200 of the compound represented by Formula 1.

Also, the present invention provides a compound having a reorganization energy value of 0.1600 to 0.2000 of the compound represented by Formula 1.

Also, the present invention provides a compound having a reorganization energy value of 0.1700 to 0.1900 of the compound represented by Formula 1.

Also, the present invention provides a compound in which the compound represented by Formula 1 is represented by any one of the following Formula 1-1 to 1-3.

Formula 1-1

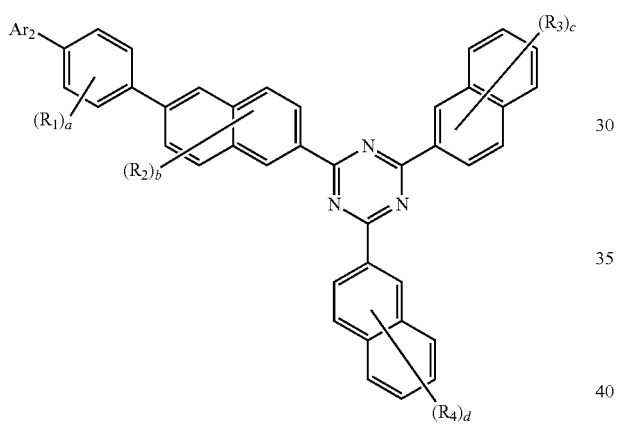

Formula 1-2

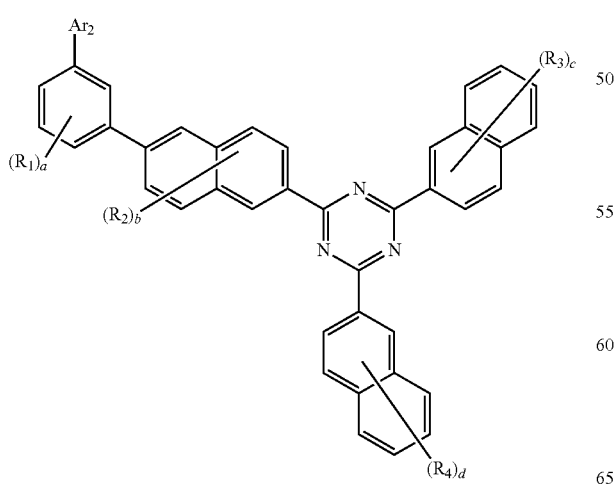

Formula 1-3

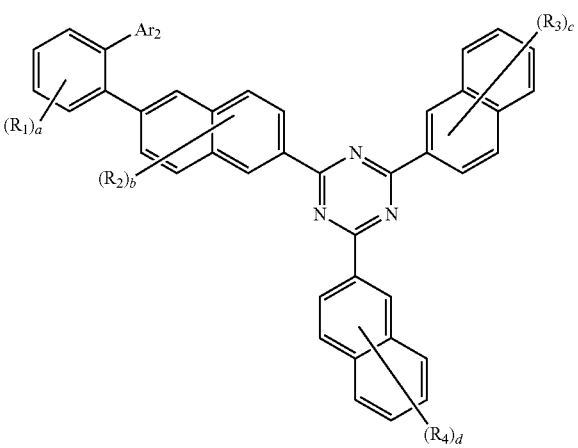

wherein:
1) $R_1$, $R_2$, $R_3$, $R_4$, a, b, c and d are the same as defined in Formula 1;
2) $Ar_2$ has the same as the definition as $Ar_1$ in Formula 1.

Also, the present invention provides a compound in which the compound represented by Formula 1 is represented by any one of the following compounds P-1 to P-50.

P-1

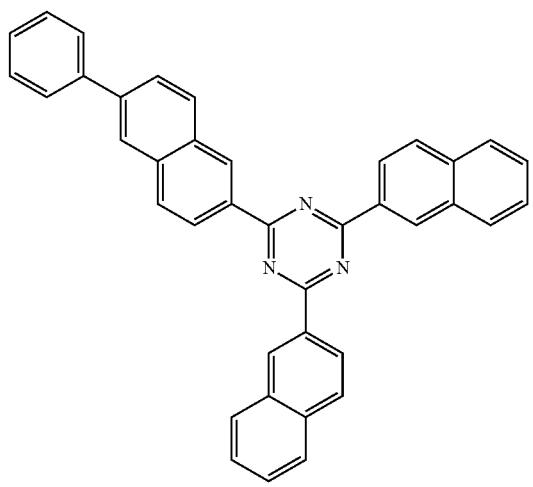

P-2
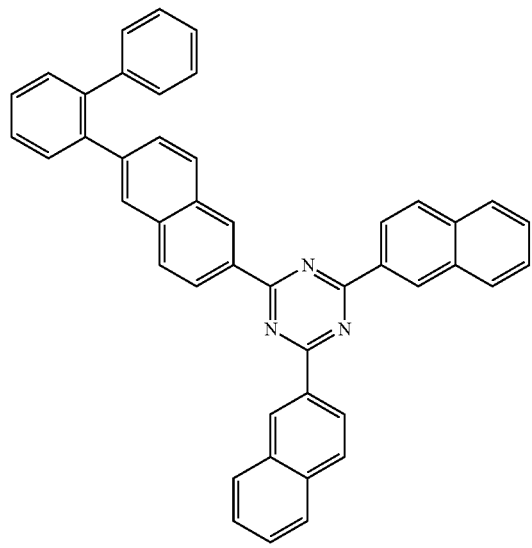
P-3
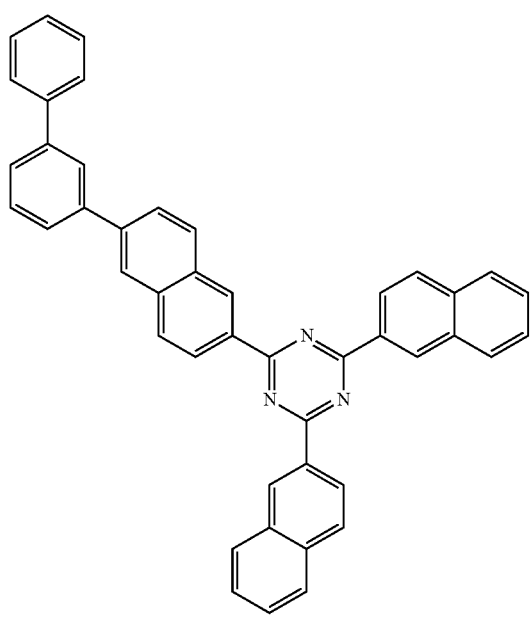
P-4
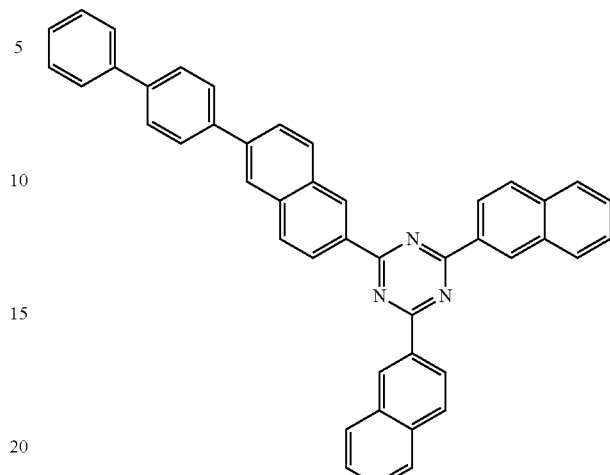
P-5
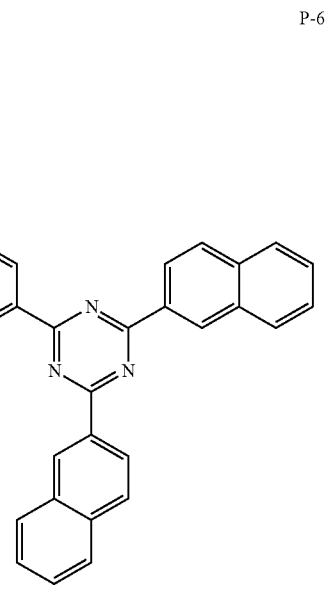
P-6

P-7
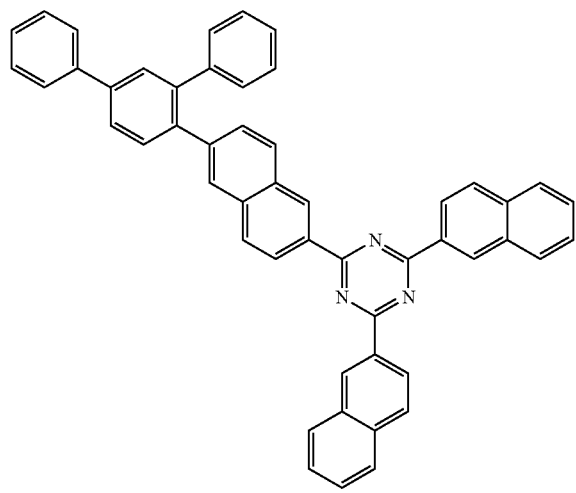
P-8
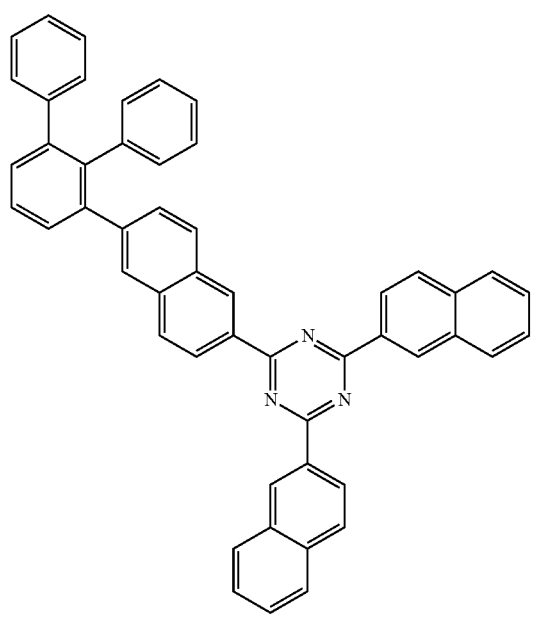
P-9
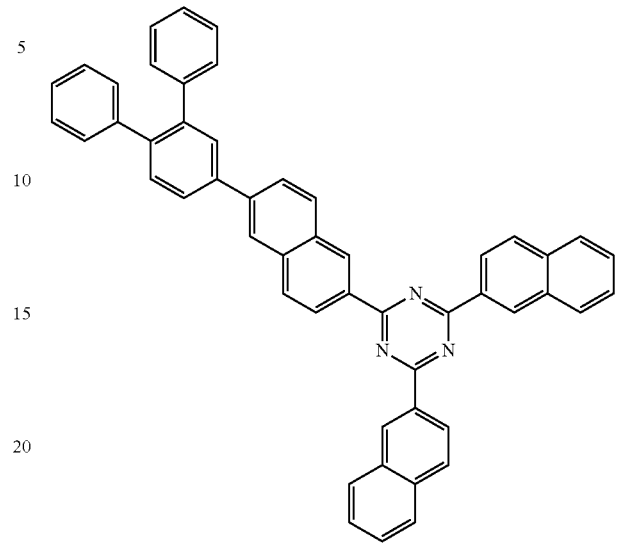
P-10
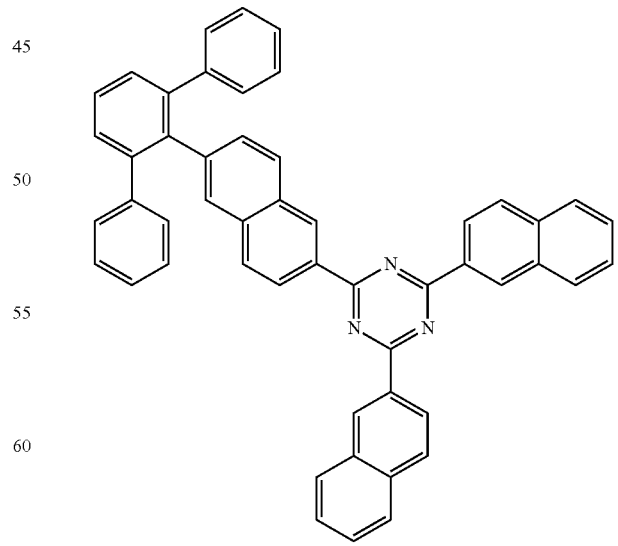

P-11
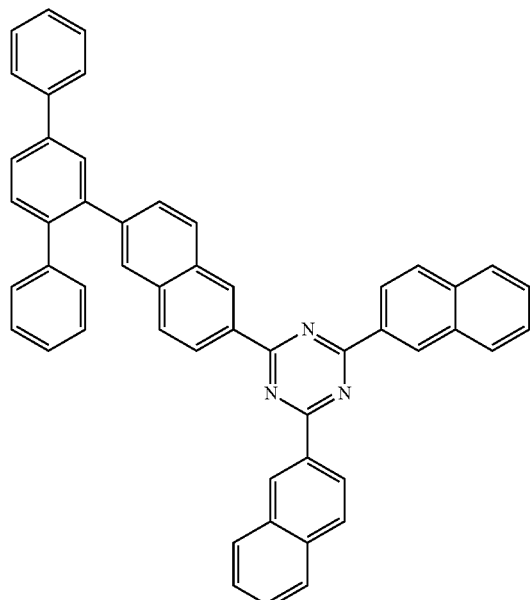
P-12
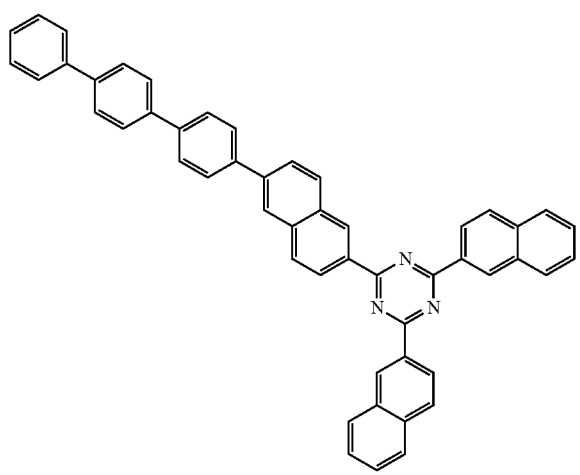
P-13
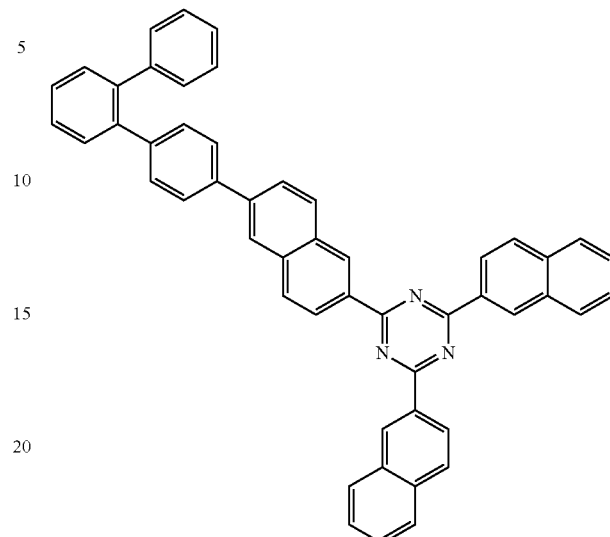
P-14
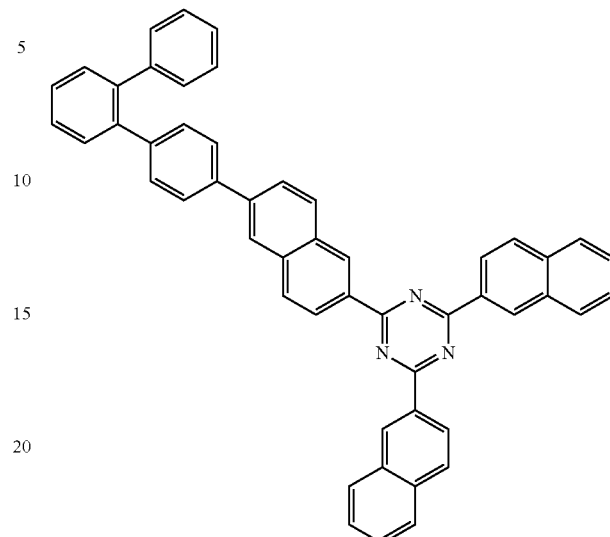

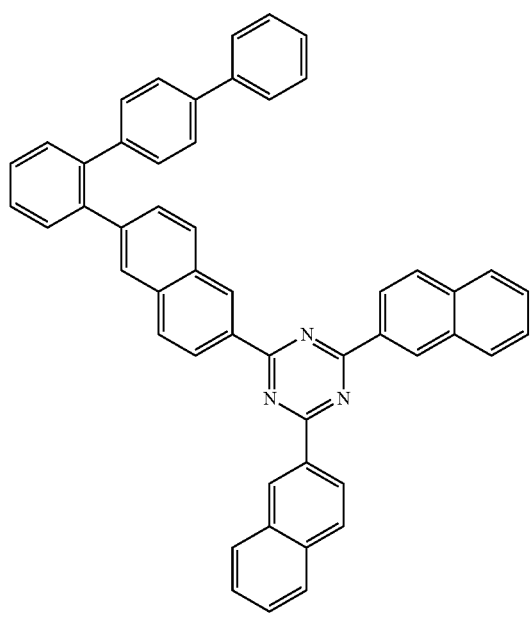
P-15
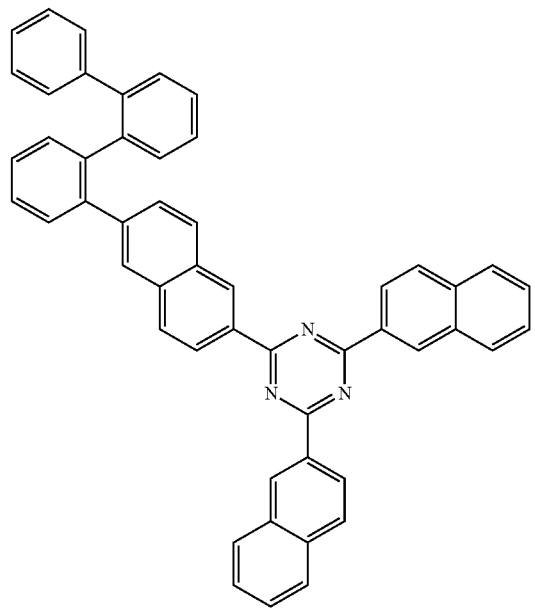
P-17
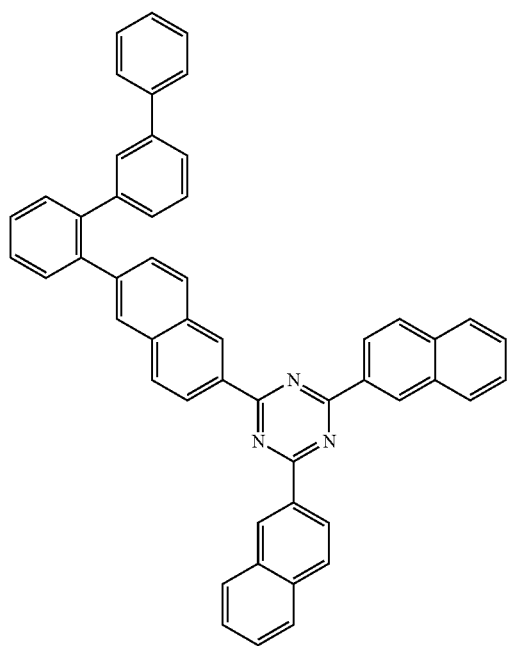
P-16
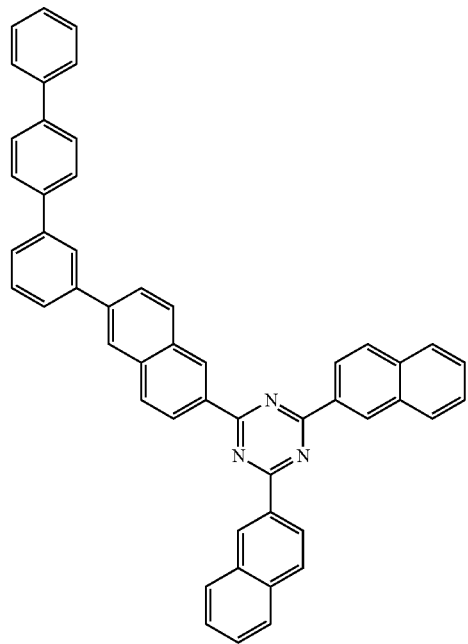
P-18

P-19
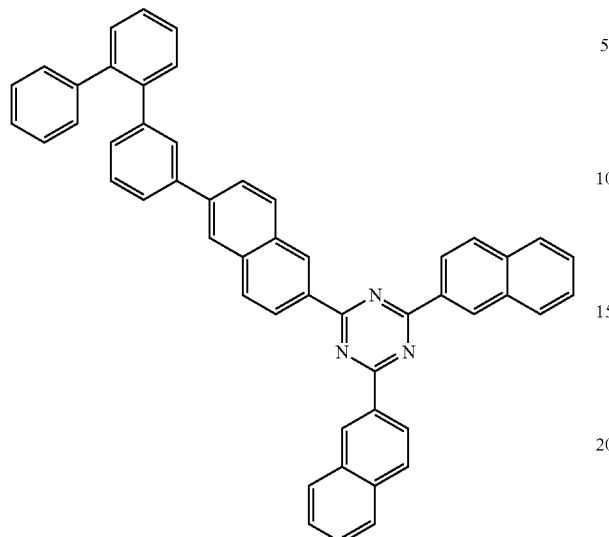
P-20
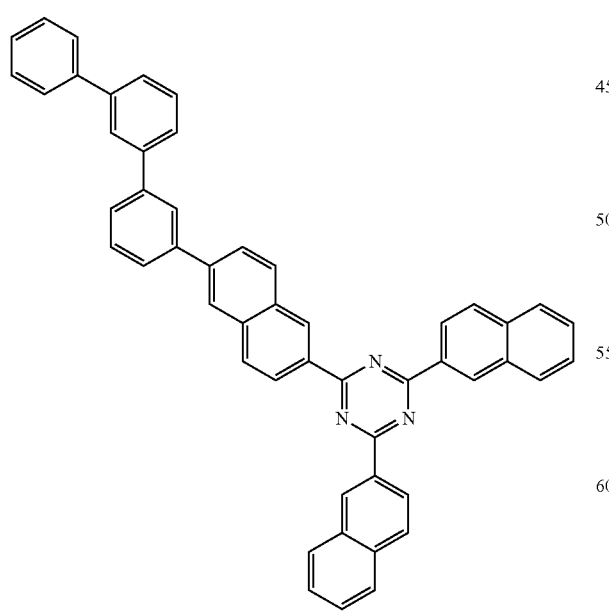
P-21
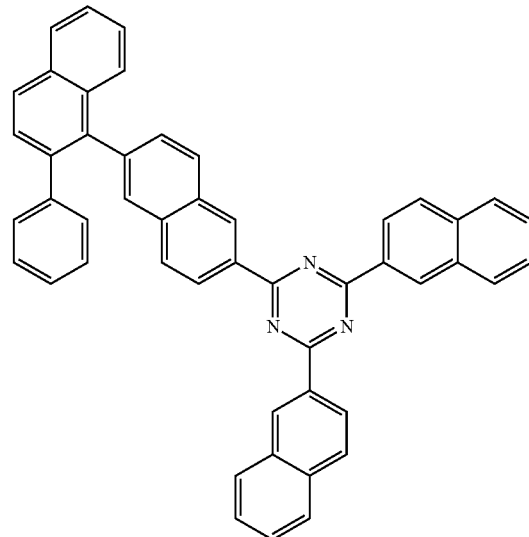
P-22
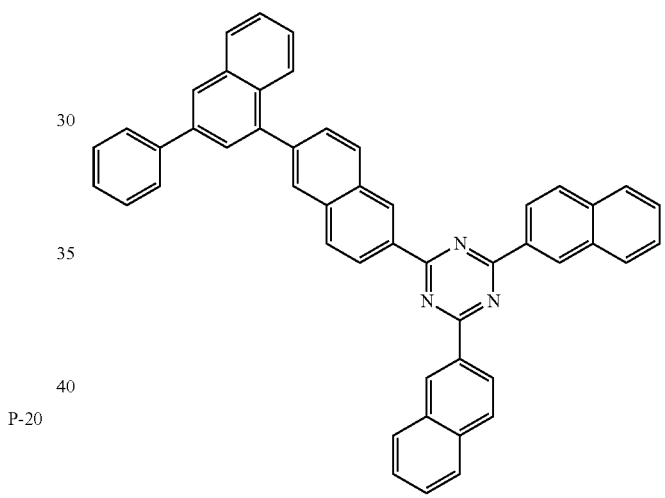
P-23

P-24
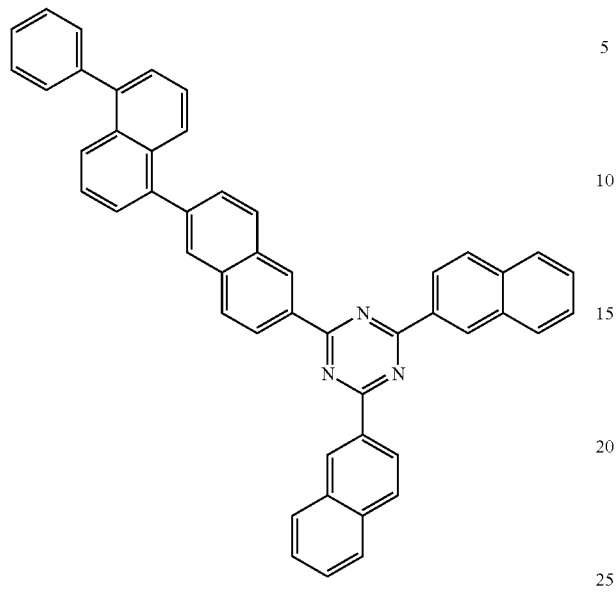
P-25
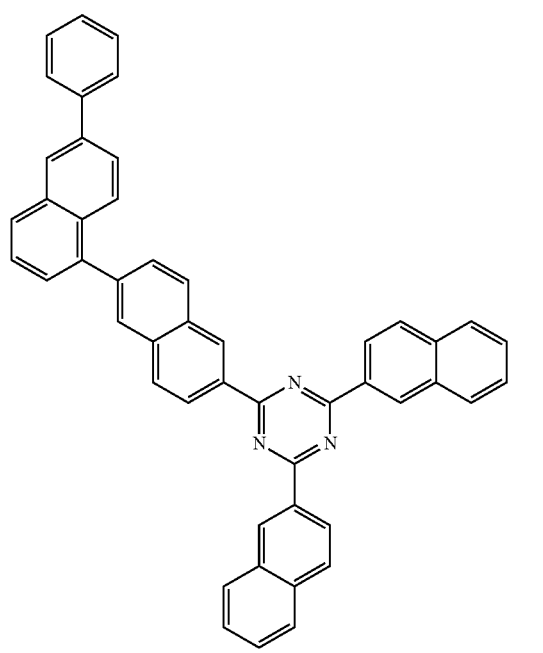
P-26
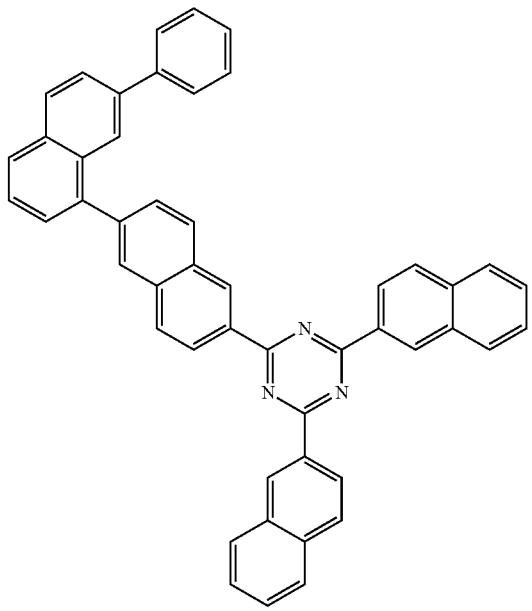
P-27
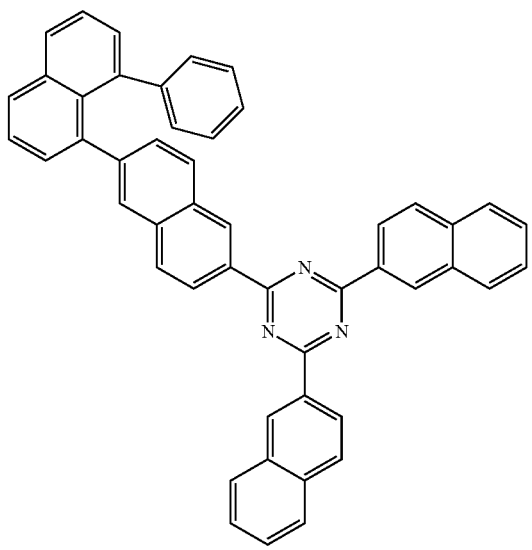

P-28
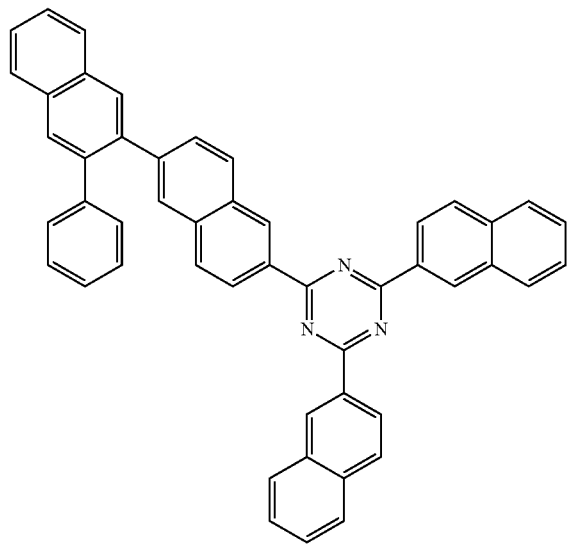
P-29
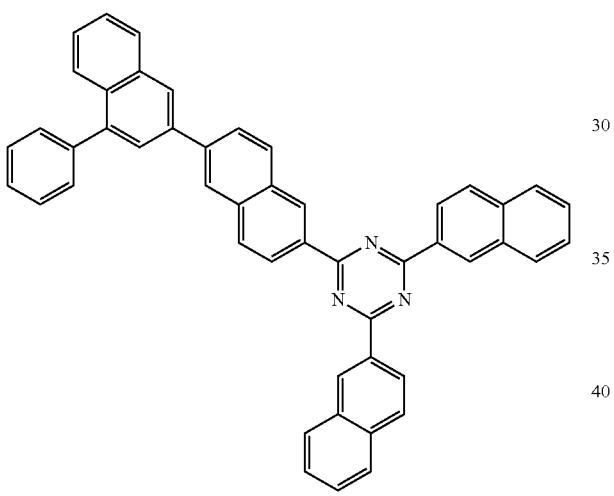
P-30
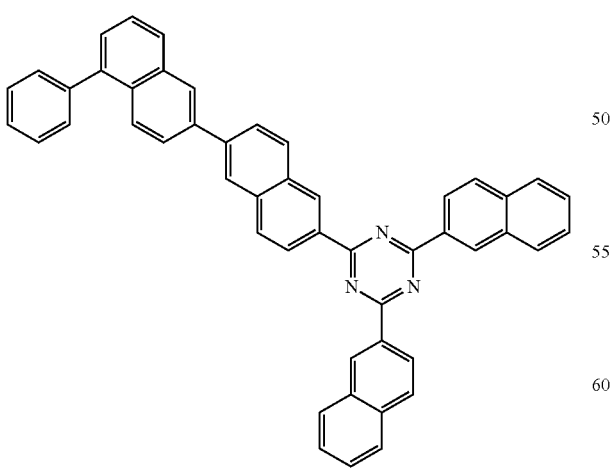
P-31
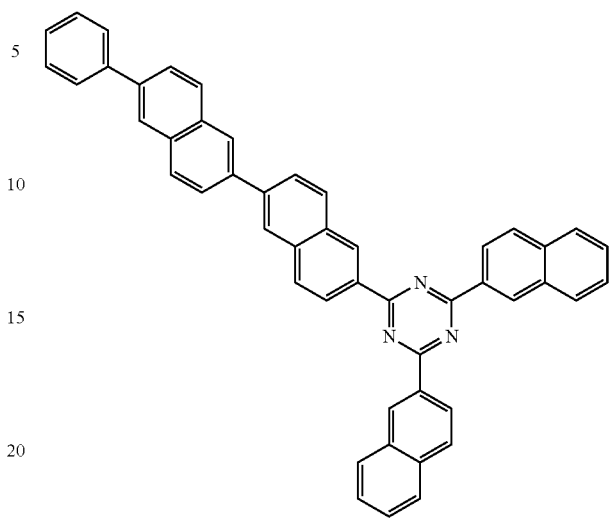
P-32
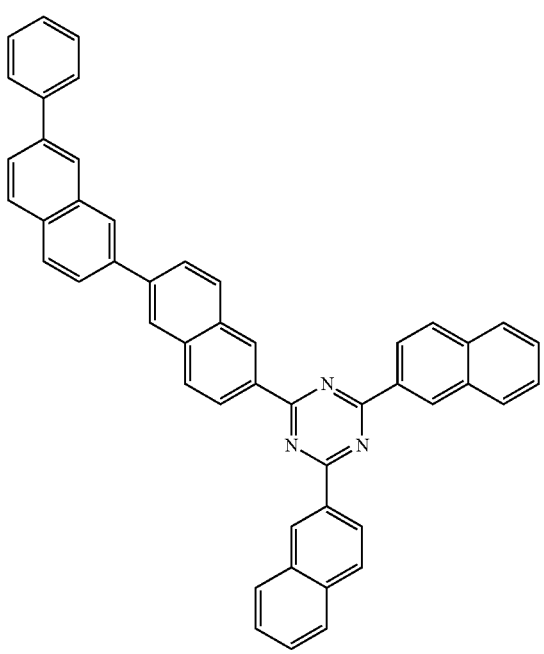

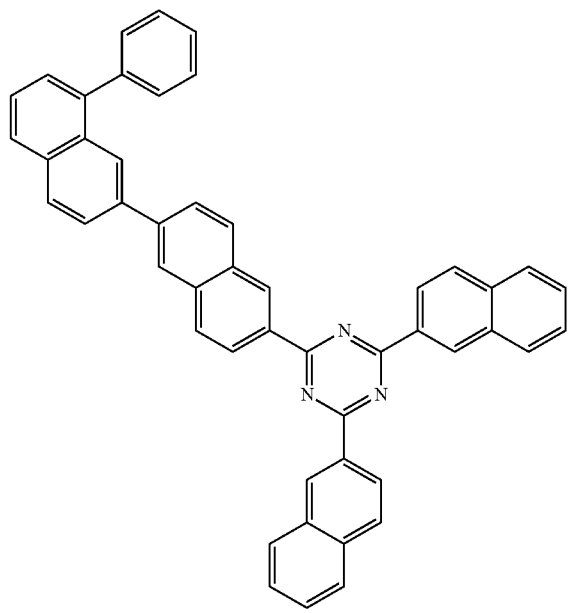
P-33
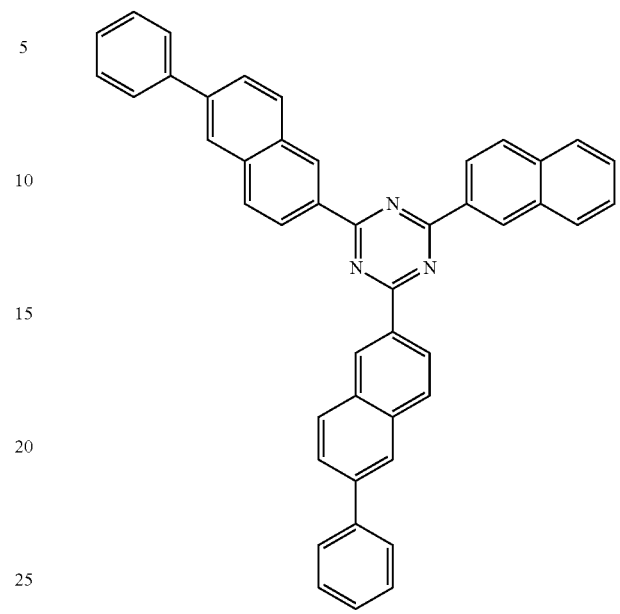
P-35
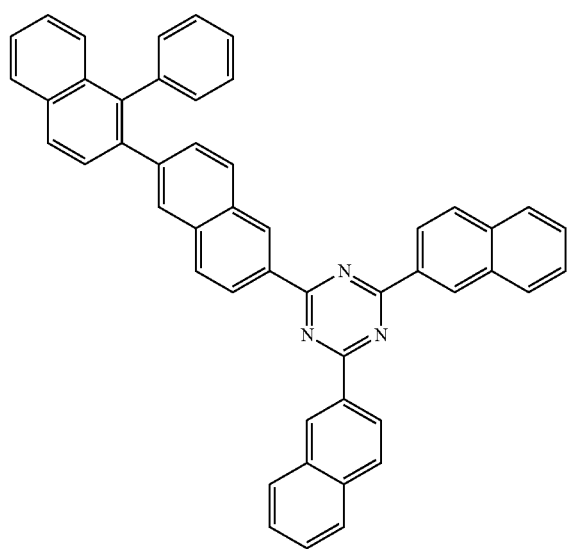
P-34
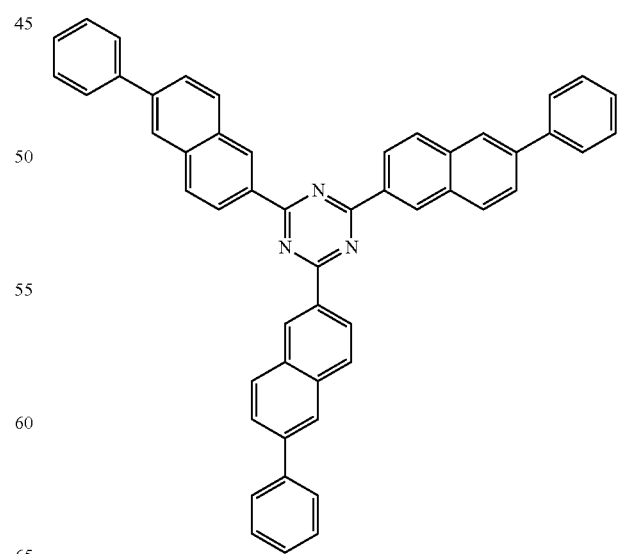
P-36

P-37
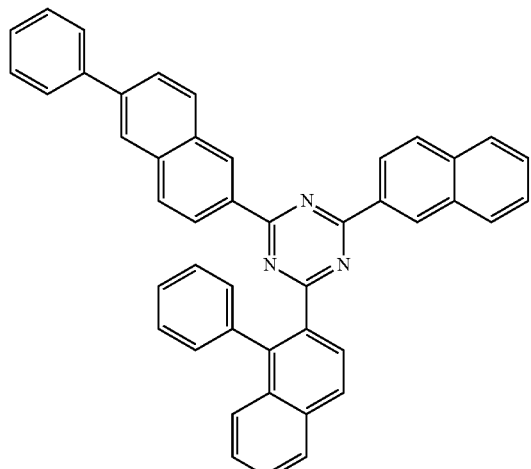
P-38
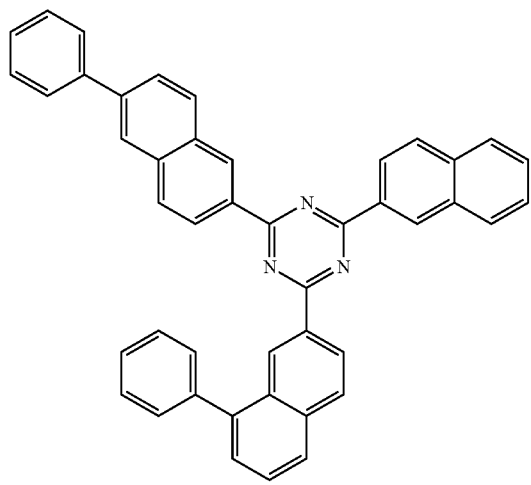
P-39
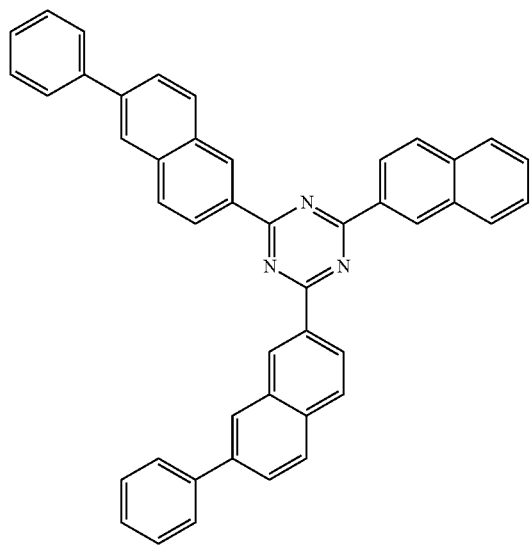
P-40
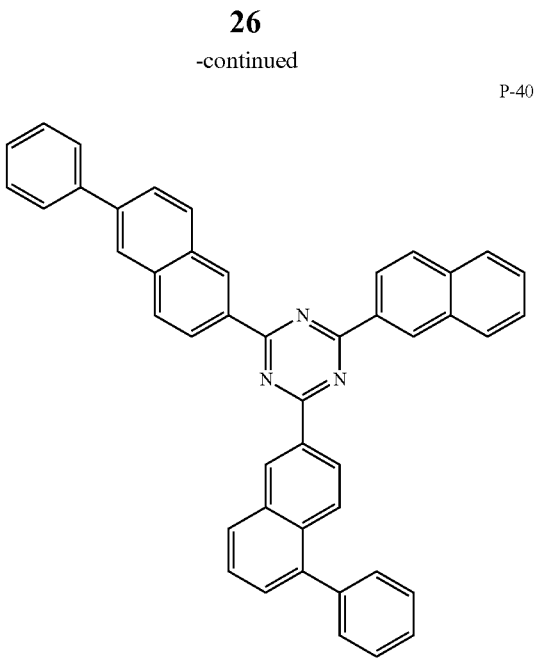
P-41
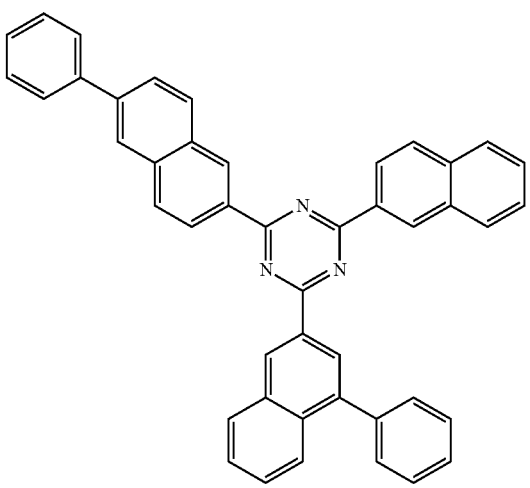
P-42
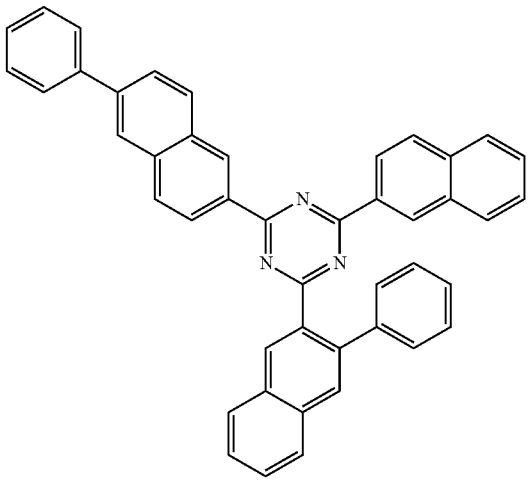

P-43
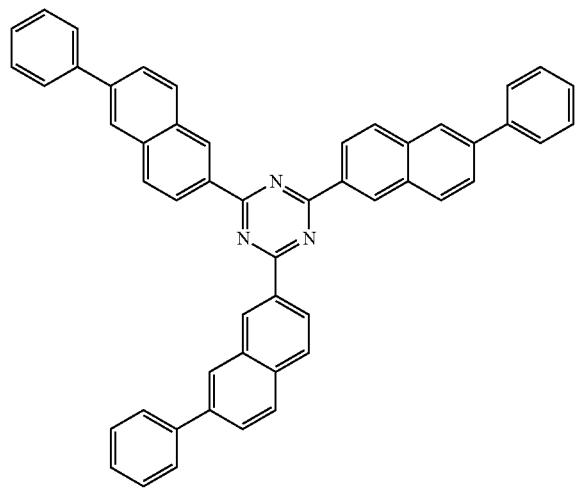
P-44
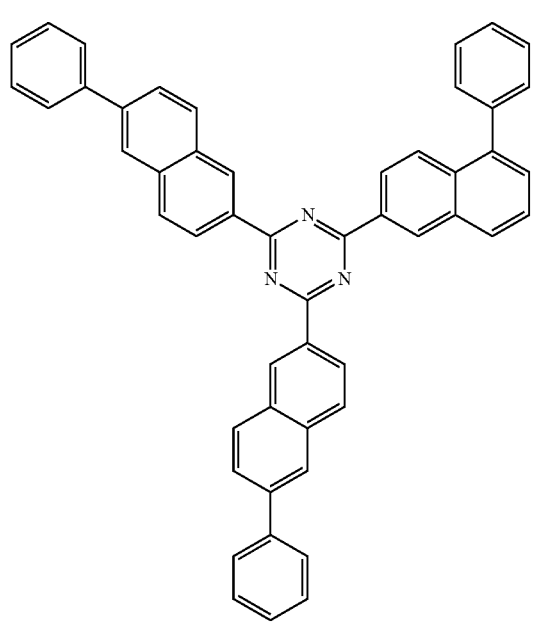
P-45
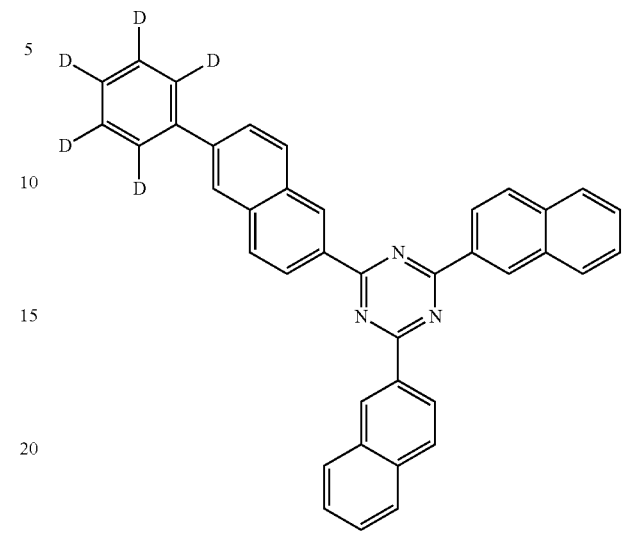
P-46

P-47

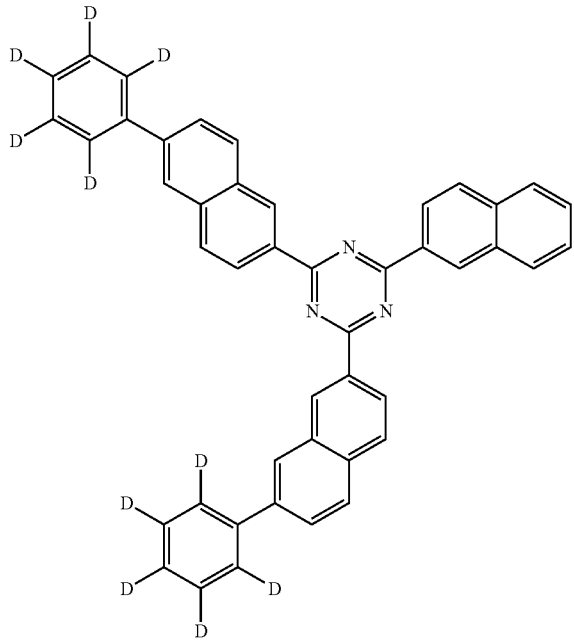

P-48

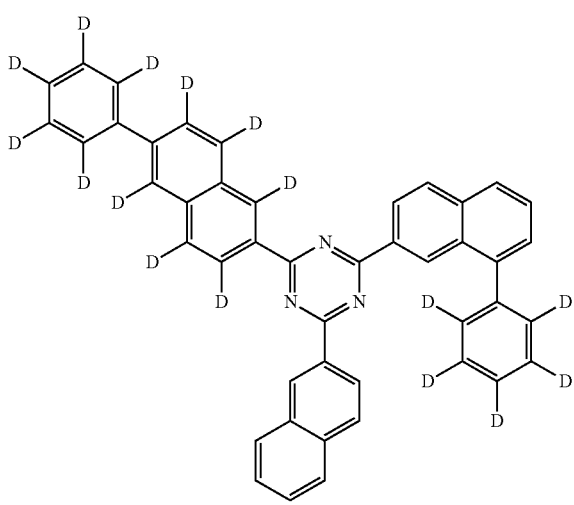

P-49

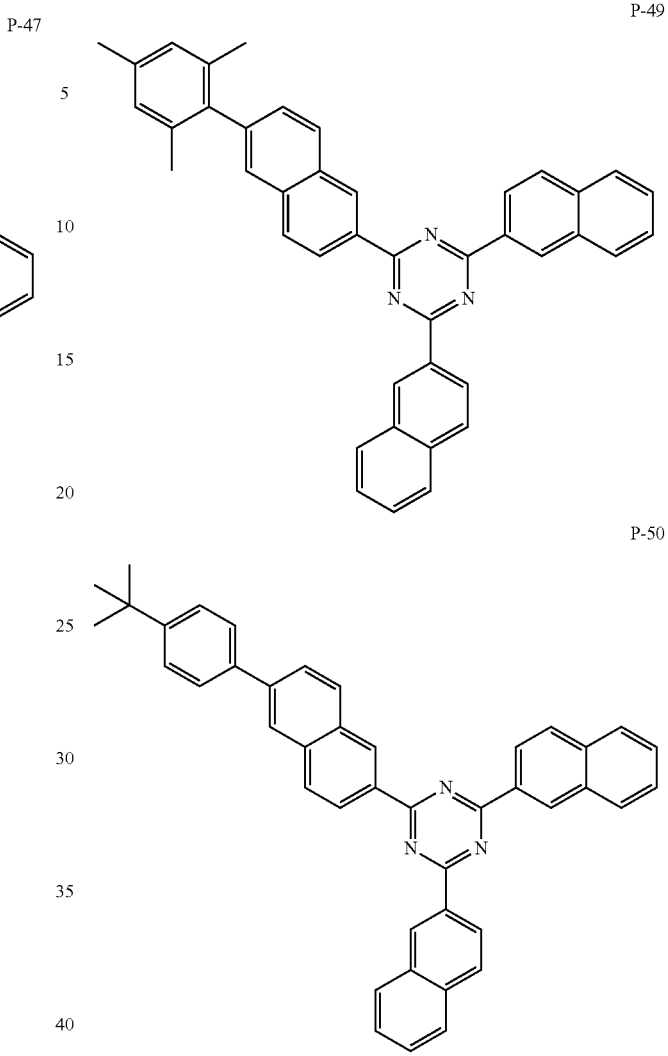

P-50

Referring to FIG. 1, the organic electronic element (100) according to the present invention includes a first electrode (110), a second electrode (170), and an organic material layer including a single compound or 2 or more compounds represented by Formula (1) between the first electrode (110) and the second electrode (170). In this case, the first electrode (110) may be an anode, and the second electrode (170) may be a cathode. In the case of an inverted type, the first electrode may be a cathode and the second electrode may be an anode.

Figure 2:
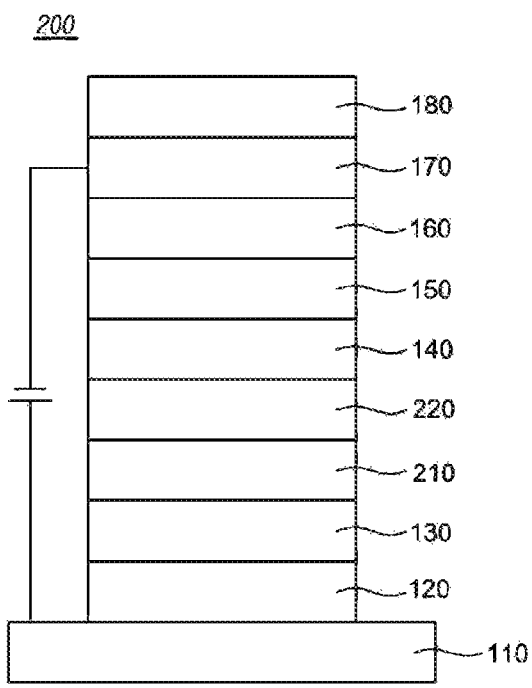

The organic material layer may sequentially include a hole injection layer (120), a hole transport layer (130), an emitting layer (140), an electron transport layer (150), and an electron injection layer (160) on the first electrode (110). In this case, the remaining layers except for the emitting layer (140) may not be formed. It may further include a hole blocking layer, an electron blocking layer, an emitting auxiliary layer (220), a buffer layer (210), etc. and the electron transport layer (150) and the like may serve as a hole blocking layer. (See FIG. 2)

Also, the organic electronic element according to an embodiment of the present invention may further include a protective layer or a light efficiency enhancing layer (180). The light efficiency enhancing layer may be formed on one of both surfaces of the first electrode not in contact with the organic material layer or on one of both surfaces of the second electrode not in contact with the organic material layer. The compound according to an embodiment of the present invention applied to the organic material layer may be used as a host or dopant of the hole injection layer (120), the hole transport layer (130), the emitting auxiliary layer (220), electron transport auxiliary layer, the electron transport layer (150), and an electron injection layer (160), the emitting layer (140) or as a material for the light efficiency enhancing layer. Preferably, for example, the compound according to Formula (1) of the present invention may be used as a host material of the emitting layer, a hole blocking layer or an electron transport layer.

Figure 3:
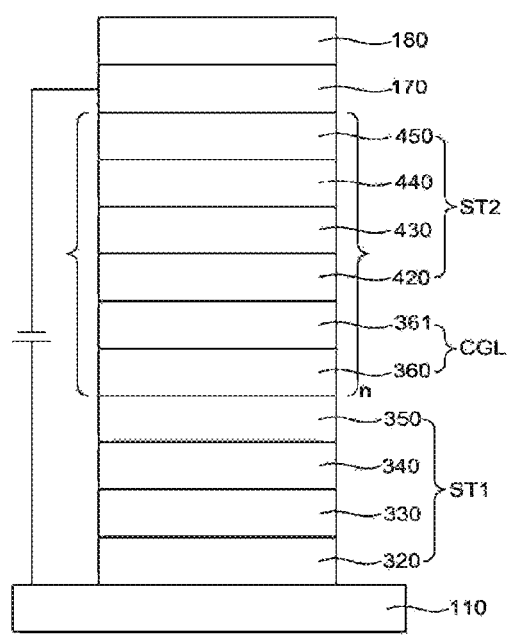

The organic material layer may include 2 or more stacks including a hole transport layer, an emitting layer and an electron transport layer sequentially formed on the anode, further include a charge generation layer formed between the 2 or more stacks (see FIG. 3).

Otherwise, even with the same core, the band gap, electrical characteristics, interface characteristics, etc. may vary depending on which position the substituent is bonded to, therefore the choice of core and the combination of sub-substituents bound thereto are also very important, and in particular, when the optimal combination of energy levels and T1 values and unique properties of materials (mobility, interfacial characteristics, etc.) of each organic material layer is achieved, a long lifespan and high efficiency can be achieved at the same time.

The organic electroluminescent device according to an embodiment of the present invention may be manufactured using a PVD (physical vapor deposition) method. For example, depositing a metal or a metal oxide having conductivity or an alloy thereof on a substrate to form an anode, and after forming an organic material layer including the hole injection layer (120), the hole transport layer (130), the emitting layer (140), the electron transport layer (150) and the electron injection layer (160) thereon, it can be prepared by depositing a material that can be used as a cathode thereon.

Also, in the present invention, the organic material layer is formed by any one of a spin coating process, a nozzle printing process, an inkjet printing process, a slot coating process, a dip coating process, and a roll-to-roll process, and the organic material layer provides an organic electric element comprising the compound as an electron transport material.

As another specific example, the same or different compounds of the compound represented by Formula (1) are mixed and used in the organic material layer.

Also, the present invention provides an emitting layer composition comprising the compound represented by Formula (1), and provides an organic electronic element comprising the emitting layer.

Also, the present invention provides a hole blocking layer composition comprising the compound represented by Formula (1), and provides an organic electronic element comprising the hole blocking layer.

Also, the present invention provides an electron transport layer composition comprising the compound represented by Formula (1), and provides an organic electronic element comprising the electron transport layer.

Also, the present invention provides an electronic device comprising a display device including the organic electronic element; and a control unit for driving the display device;

In another aspect, the organic electronic element is at least one of an organic electroluminescent device, an organic solar cell, an organic photoreceptor, an organic transistor, and a device for monochromatic or white lighting. At this time, the electronic device may be a current or future wired/wireless communication terminal, and covers all kinds of electronic devices including mobile communication terminals such as mobile phones, a personal digital assistant (PDA), an electronic dictionary, a point-to-multipoint (PMP), a remote controller, a navigation unit, a game player, various kinds of TVs, and various kinds of computers.

Hereinafter, a synthesis example of the compound represented by Formula (1) of the present invention and a manufacturing example of an organic electronic element of the present invention will be described in detail with reference to Examples, but the present invention is not limited to the following Examples.

SYNTHESIS EXAMPLE

The compound (final products) represented by Formula (1) according to the present invention is synthesized by reacting Sub 1 and Sub 2 as shown in Scheme 1 below, but is not limited thereto.

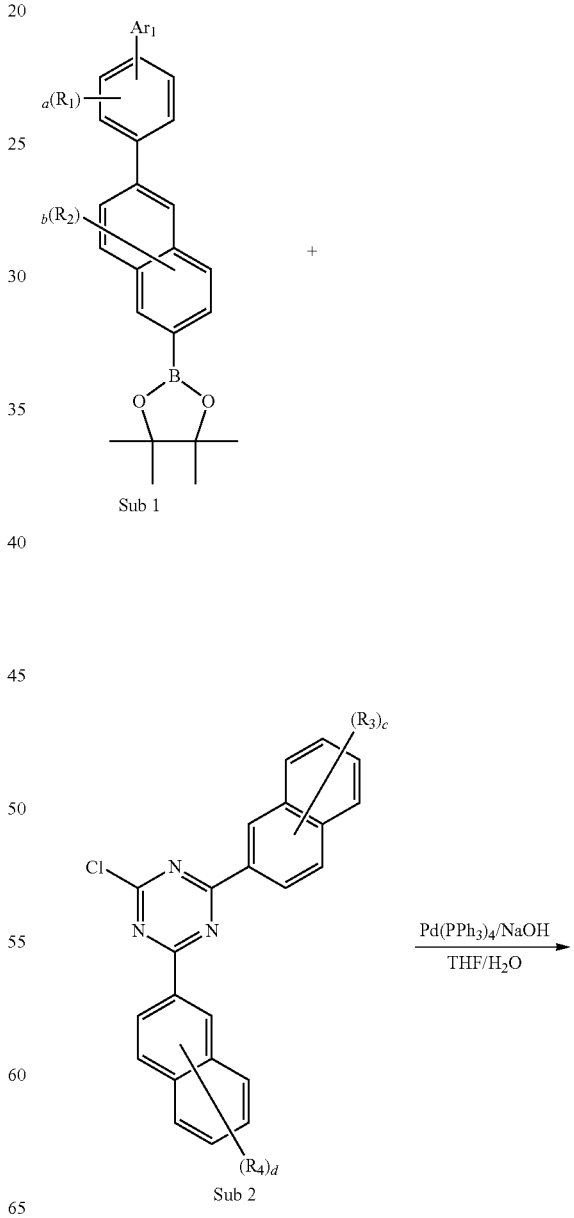

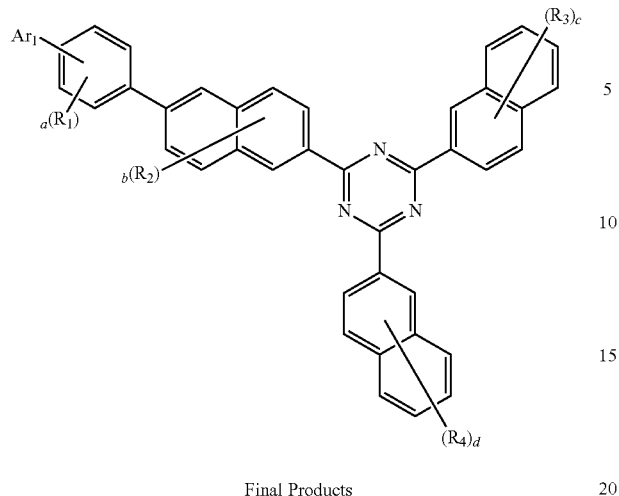
Final Products
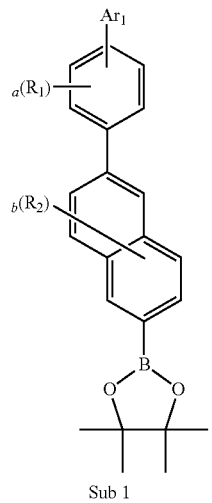
Sub 1
I. Synthesis of Sub 1
Sub 1 of Reaction Scheme 1 may be synthesized by the reaction route of Reaction Scheme 2 below, but is not limited thereto.
Synthesis examples of specific compounds belonging to Sub 1 are as follows.
1. Synthesis Example Sub 1-1
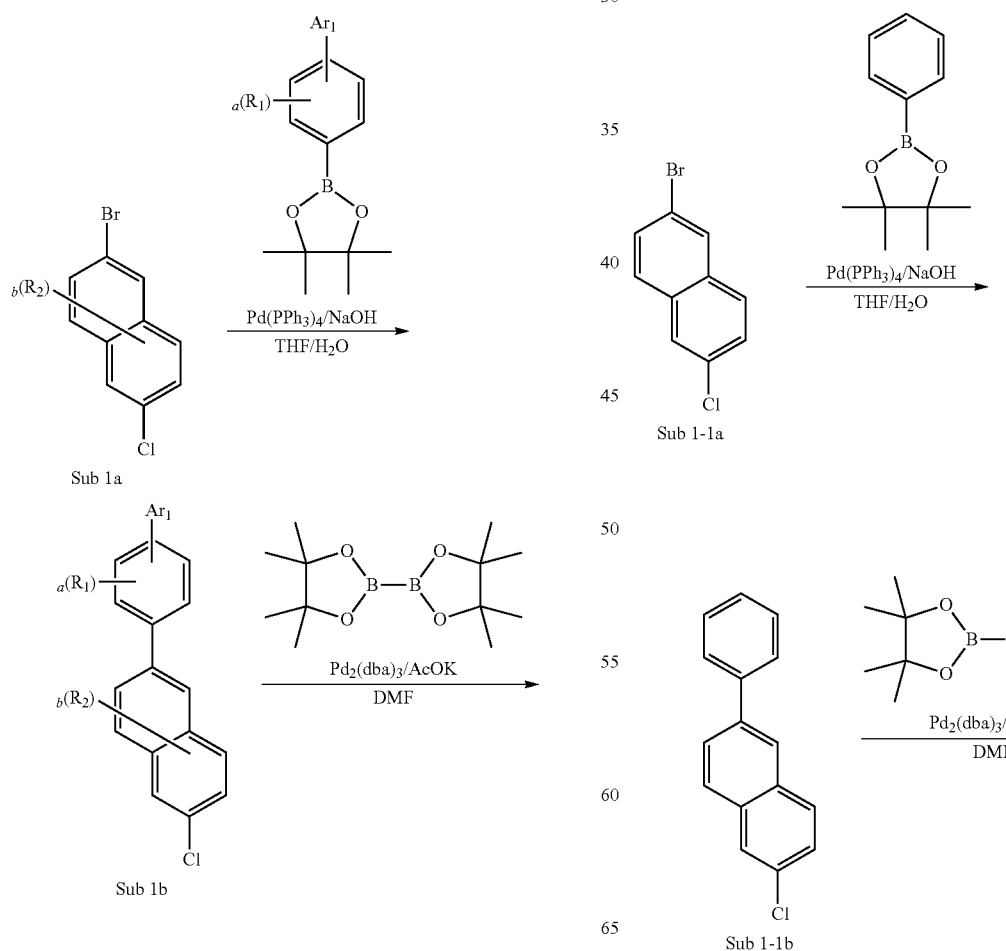

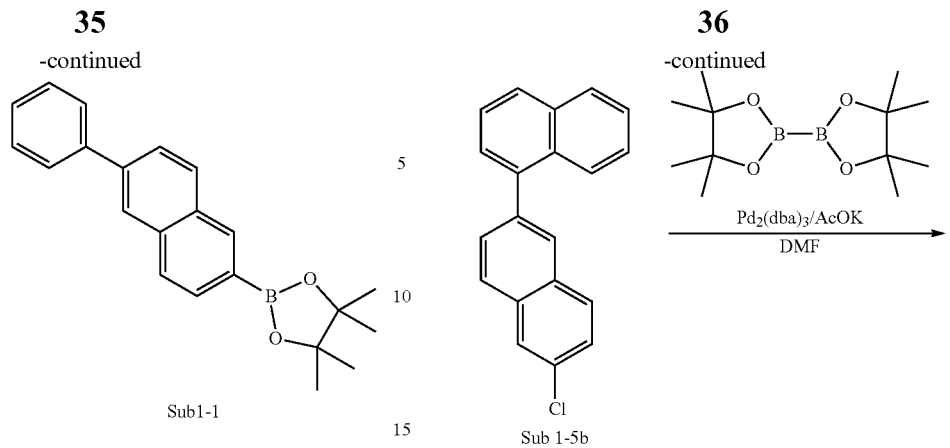

Sub1-1

(1) Synthesis of Sub 1-1 b 4,4,5,5-tetramethyl-2-phenyl-1,3,2-dioxaborolane (42.4 g, 0.21 mol), Pd(PPh$_3$)$_4$ (7.2 g, 0.006 mol), NaOH (24.8 g, 0.62 mol), THF (415 mL) and water (415 mL) were added to Sub 1-la (50 g, 0.21 mol), and the reaction was conducted at 70° C. for 6 hours. When the reaction is completed, the temperature of the reactant is cooled to room temperature, and the solvent is removed. Then, the concentrated reactant was separated using a silica gel column or recrystallization method to obtain 40 g (80.9%) of the product Sub 1-1b.

(2) Synthesis of Sub 1-1

Sub 1-1b (40 g, 0.17 mol), 4,4,4',4',5,5,5',5'-octamethyl-2,2'-bi(1,3,2-dioxaborolane) (42.4 g, 0.17 mol), Pd$_2$(dba)$_3$ (4.6 g, 0.005 mol), AcOK (49.3 g, 0.5 mol) were added to DMF (335 mL) and stirred at 160° C. for 8 hours.

When the reaction was completed, the reaction solvent was removed and the concentrated organic material was separated using a silica gel column or recrystallization method to obtain 42 g (76%) of Sub 1-1.

2. Synthesis Example Sub 1-5

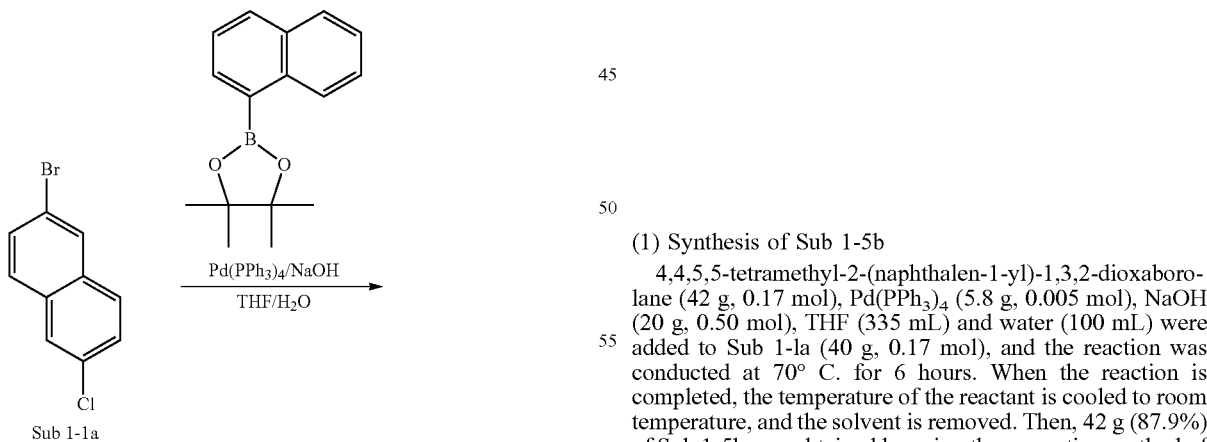

(1) Synthesis of Sub 1-5b 4,4,5,5-tetramethyl-2-(naphthalen-1-yl)-1,3,2-dioxaborolane (42 g, 0.17 mol), Pd(PPh$_3$)$_4$ (5.8 g, 0.005 mol), NaOH (20 g, 0.50 mol), THF (335 mL) and water (100 mL) were added to Sub 1-la (40 g, 0.17 mol), and the reaction was conducted at 70° C. for 6 hours. When the reaction is completed, the temperature of the reactant is cooled to room temperature, and the solvent is removed. Then, 42 g (87.9%) of Sub 1-5b was obtained by using the separation method of Sub 1-1b described above.

(2) Synthesis of Sub 1-5

Sub 1-5b (40 g, 0.14 mol), 4,4,4',4',5,5,5',5'-octamethyl-2,2'-bi(1,3,2-dioxaborolane) (35.1 g, 0.14 mol), Pd$_2$(dba)$_3$ (3.8 g, 0.004 mol), AcOK (40.8 g, 0.4 mol) were added to DMF (277 mL) and stirred at 160° C. for 8 hours. When the reaction was completed, 40 g (75.8%) of the product Sub 1-5 was obtained by using the separation method for Sub 1-1.

3. Synthesis Example Sub 1-10

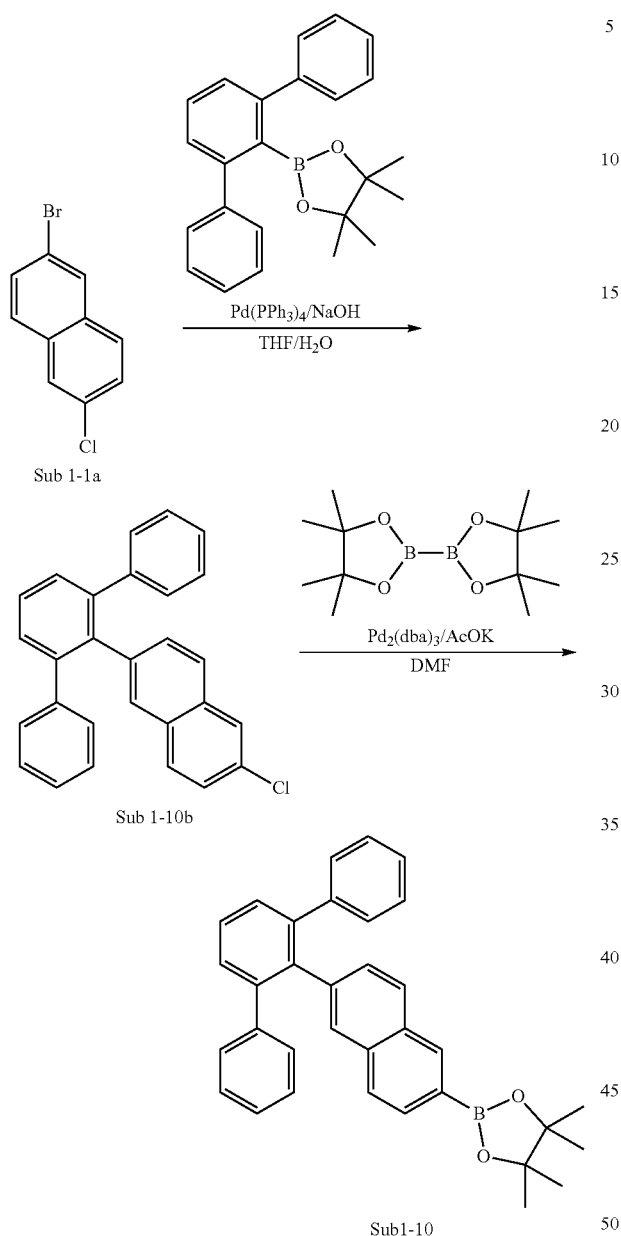

(1) Synthesis of Sub 1-10b 2-([1,1': 3',1''-terphenyl]-2'-yl)-4,4,5,5-tetramethyl-1,3,2-dioxaborolane (44.3 g, 0.12 mol), Pd(PPh₃)₄ (4.3 g, 0.004 mol), NaOH (15 g, 0.37 mol), THF (250 mL) and water (110 mL) were added to Sub 1-1a (30 g, 0.12 mol), and the reaction was conducted at 70° C. for 6 hours. When the reaction is completed, the temperature of the reactant is cooled to room temperature, and the solvent is removed. Thereafter, 32 g (86.3%) of the product Sub 1-10b was obtained by using the separation method of Sub 1-1b.

(2) Synthesis of Sub 1-10

Sub 1-10b (40 g, 0.08 mol), 4,4,4',4',5,5,5',5'-octamethyl-2,2'-bi(1,3,2-dioxaborolane) (19.5 g, 0.08 mol), Pd₂(dba)₃ (2.1 g, 0.002 mol), AcOK (22.6 g, 0.2 mol) were added to DMF (150 mL) and stirred at 160° C. for 8 hours. When the reaction was completed, 32 g (86.3%) of the product Sub 1-10 was obtained by using the separation method of Sub 1-1.

4. Synthesis Example Sub 1-23

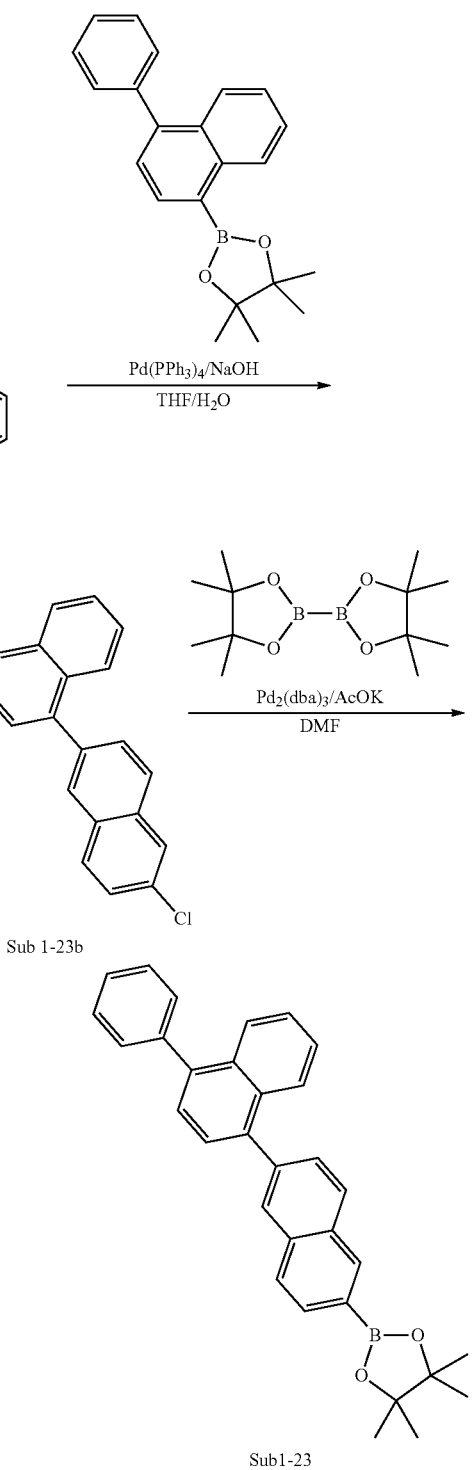

(1) Synthesis of Sub 1-23b 4,4,5,5-tetramethyl-2-(4-phenylnaphthalen-1-yl)-1,3,2-dioxaborolane (54.8 g, 0.17 mol), Pd(PPh₃)₄ (5.8 g, 0.005 mol), NaOH (19.9 g, 0.5 mol), THF (330 mL) and water (110 mL) were added to Sub 1-1a (40 g, 0.17 mol), and the reaction was conducted at 70° C. for 6 hours. When the reaction was completed, 50 g (82.8%) of the product Sub 1-23b was obtained by using the separation method of Sub 1-1b.

(2) Synthesis of Sub 1-23

Sub 1-23b (50 g, 0.14 mol), 4,4,4',4',5,5,5',5'-octamethyl-2,2'-bi(1,3,2-dioxaborolane) (34.8 g, 0.14 mol), Pd$_2$(dba)$_3$ (3.8 g, 0.004 mol), AcOK (40.4 g, 0.4 mol) were added to DMF (280 mL) and stirred at 160° C. for 8 hours. When the reaction was completed, 53 g (84.6%) of the product Sub 1-23 was obtained by using the separation method of Sub 1-1.

5. Synthesis Example Sub 1-31

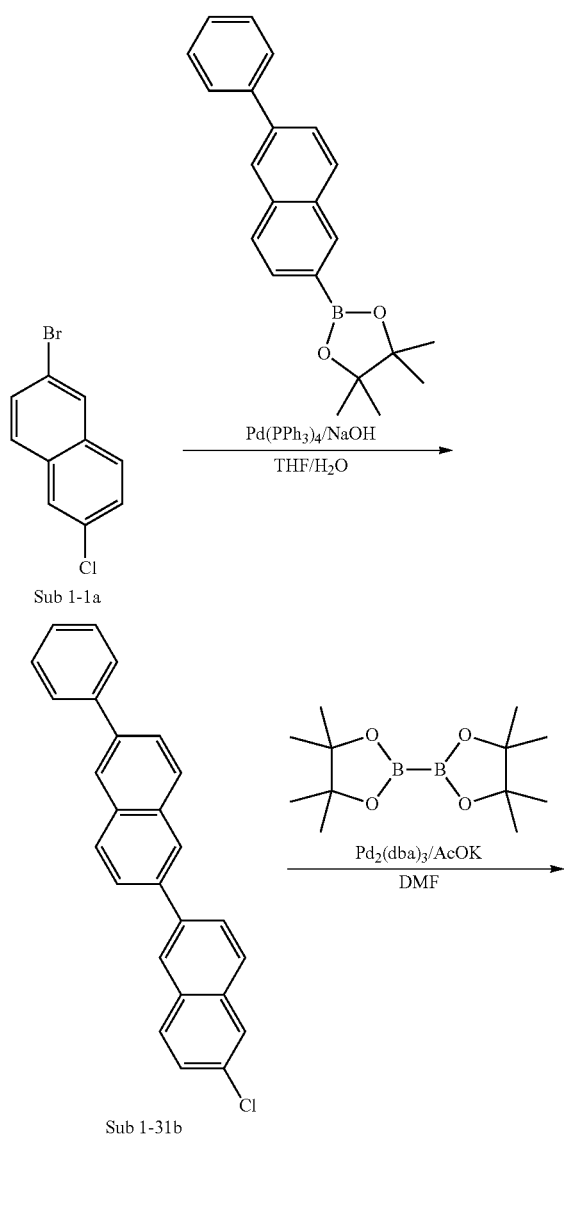

(1) Synthesis of Sub 1-31b 4,4,5,5-tetramethyl-2-(6-phenylnaphthalen-2-yl)-1,3,2-dioxaborolane (41.1 g, 0.12 mol), Pd(PPh$_3$)$_4$ (4.3 g, 0.004 mol), NaOH (14.9 g, 0.37 mol), THF (250 mL) and water (80 mL) were added to Sub 1-1a (30 g, 0.12 mol), and the reaction was conducted at 70° C. for 6 hours. When the reaction was completed, 41 g (90.5%) of the product Sub 1-31b was obtained by using the separation method of Sub 1-1b.

(2) Synthesis of Sub 1-31

Sub 1-31b (30 g, 0.08 mol), 4,4,4',4',5,5,5',5'-octamethyl-2,2'-bi(1,3,2-dioxaborolane) (20.9 g, 0.08 mol), Pd$_2$(dba)$_3$ (2.3 g, 0.0025 mol), AcOK (24.2 g, 0.25 mol) were added to DMF (164 mL) and stirred at 160° C. for 8 hours. When the reaction was completed, 33 g (87.8%) of the product Sub 1-31 was obtained by using the separation method of Sub 1-1.

6. Synthesis Example Sub 1-36

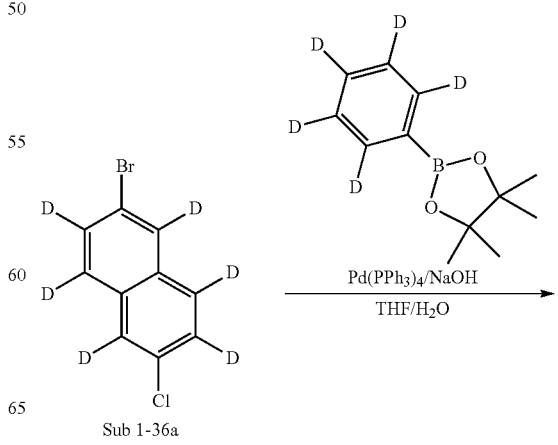

-continued

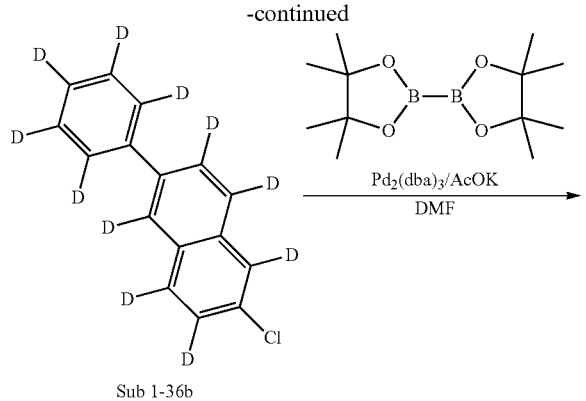

Sub 1-36b

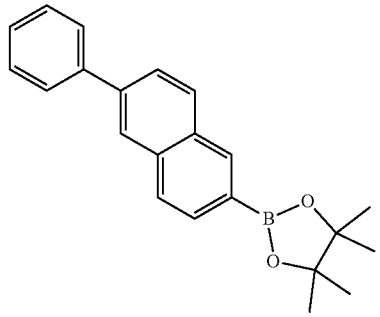

Sub1-1

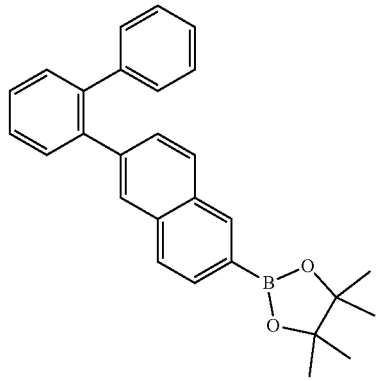

Sub1-2

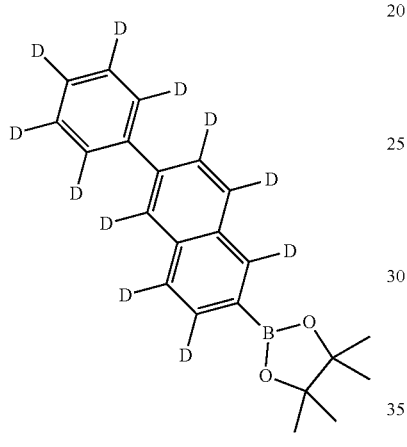

Sub1-36

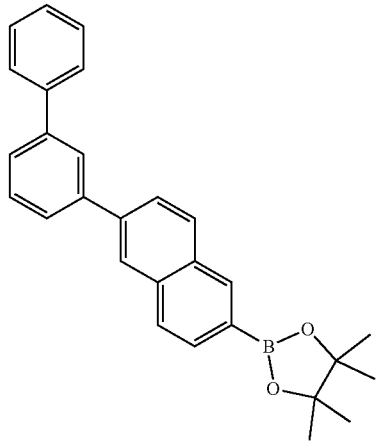

Sub1-3

(1) Synthesis of Sub 1-36b 4,4,5,5-tetramethyl-2-(phenyl-d5)-1,3,2-dioxaborolane (25.3 g, 0.12 mol), Pd(PPh$_3$)$_4$ (4.3 g, 0.004 mol), NaOH (14.9 g, 0.37 mol), THF (250 mL) and water (80 mL) were added to Sub 1-36a (30 g, 0.12 mol), and the reaction was conducted at 70° C. for 6 hours. When the reaction was completed, 25 g (82.8%) of the product Sub 1-31b was obtained by using the separation method of Sub 1-1b.

(2) Synthesis of Sub 1-36

Sub 1-36b (25 g, 0.10 mol), 4,4,4',4',5,5,5',5'-octamethyl-2,2'-bi(1,3,2-dioxaborolane) (25.4 g, 0.10 mol), Pd$_2$(dba)$_3$ (2.8 g, 0.003 mol), AcOK (29.5 g, 0.30 mol) were added to DMF (200 mL) and stirred at 160° C. for 8 hours. When the reaction was completed, 30 g (87.6%) of the product Sub 1-36 was obtained by using the separation method of Sub 1-1.

Meanwhile, the compound belonging to Sub 1 may be the following compounds, but is not limited thereto, and Table 1 below shows FD-MS values of the compounds belonging to Sub 1.

Sub1-4

Sub1-5
Sub1-6
Sub1-7
Sub1-8
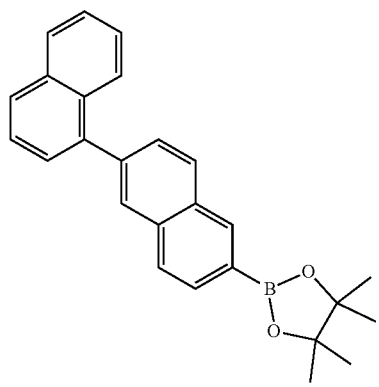
Sub1-9
Sub1-10
Sub1-11
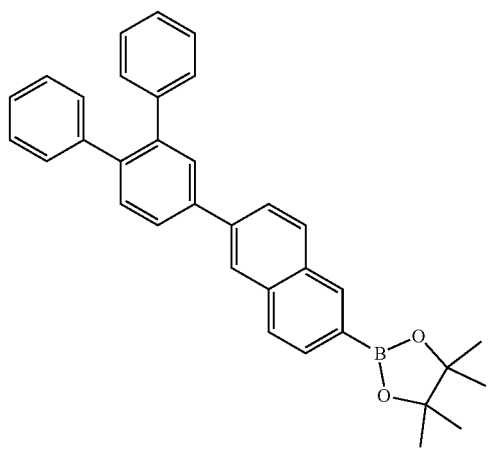

Sub1-12
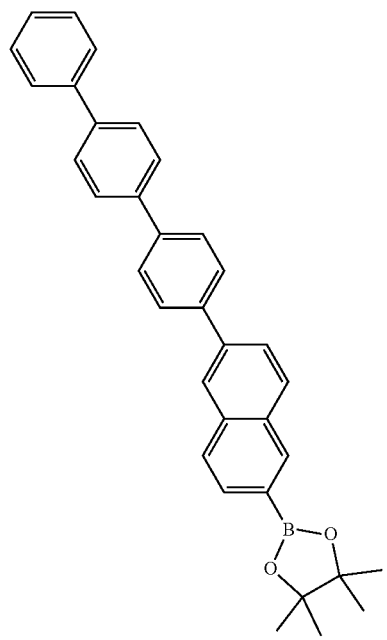
Sub1-13
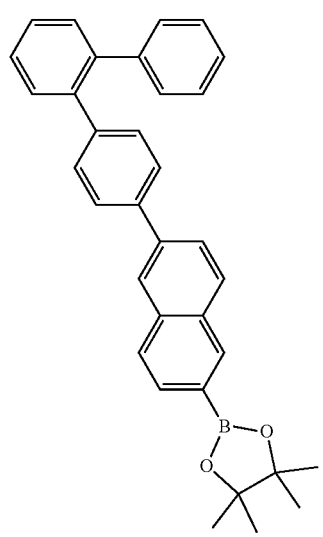
Sub1-14
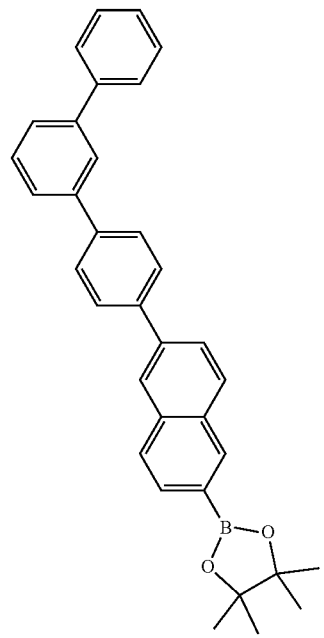
Sub1-15
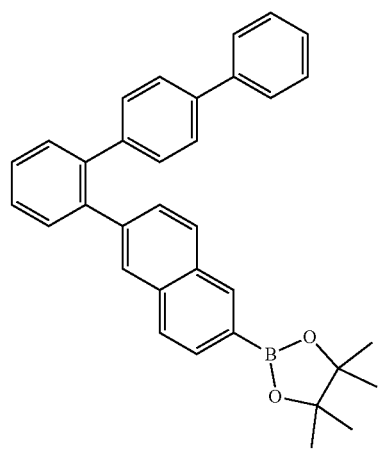
Sub1-16

Sub1-17
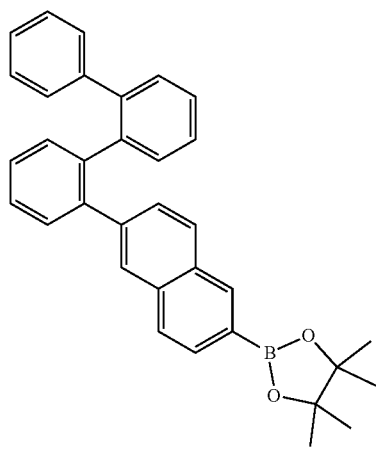
Sub1-18
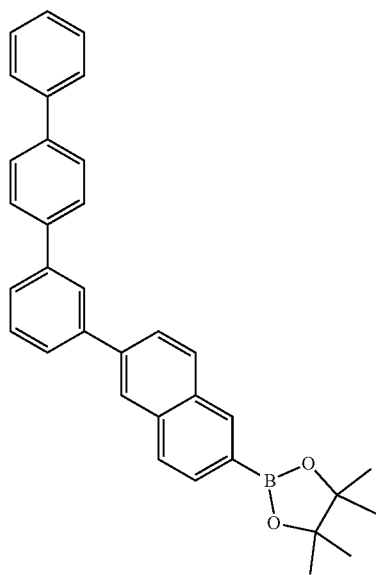
Sub1-19
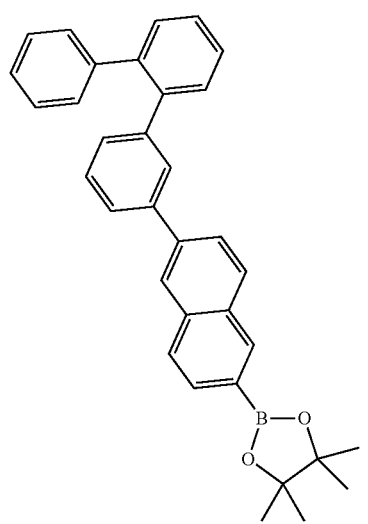
Sub1-20
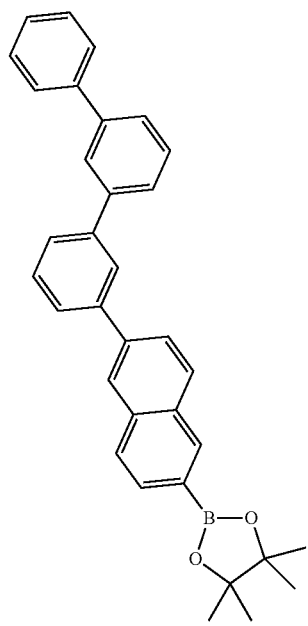
Sub1-21
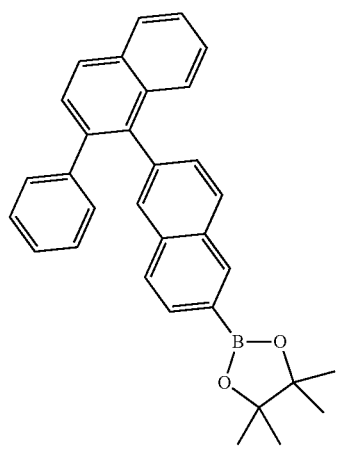
Sub1-22
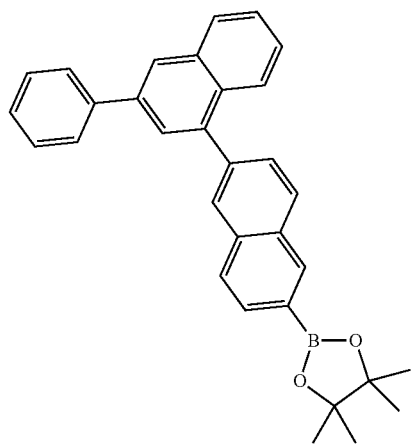

Sub1-23
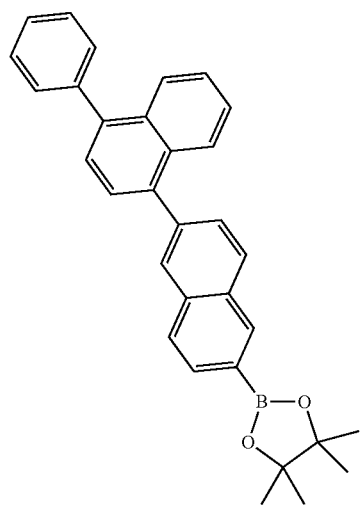
Sub1-24
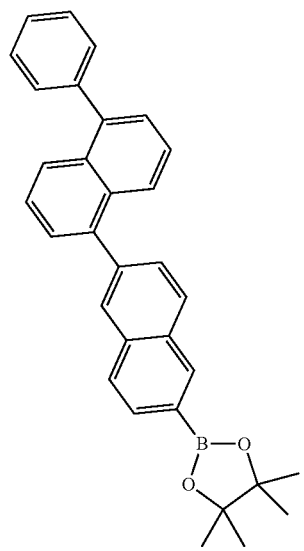
Sub1-25
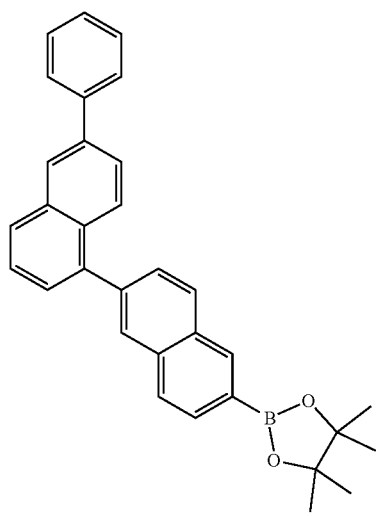
Sub1-26
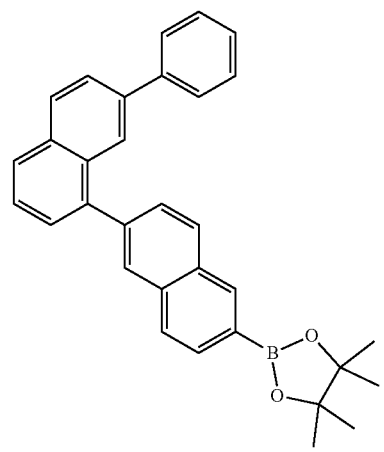
Sub1-27
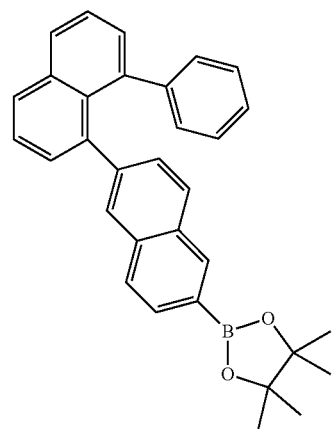
Sub1-28
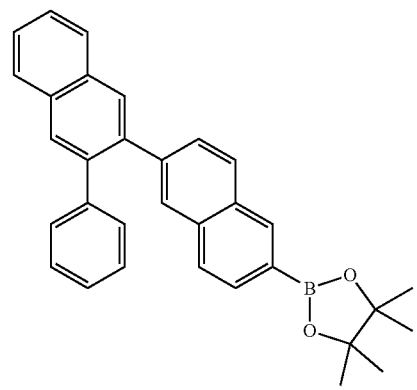

Sub1-29
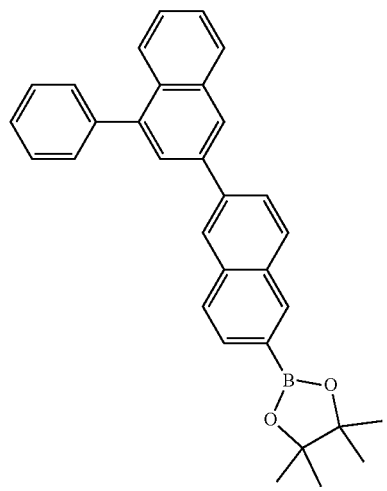
Sub1-30
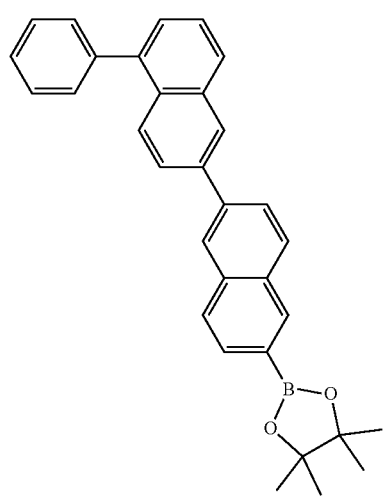
Sub1-31
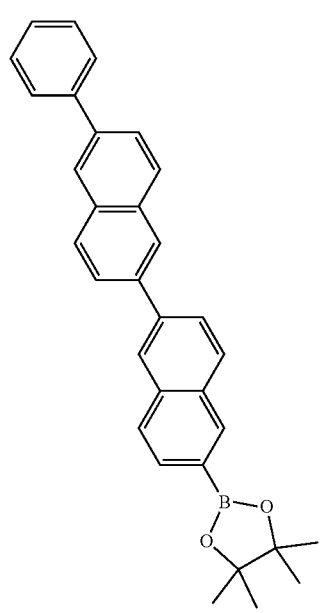
Sub1-32
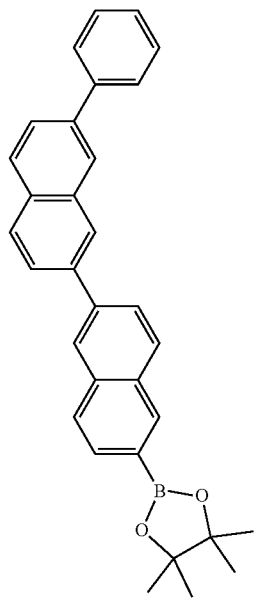
Sub1-33
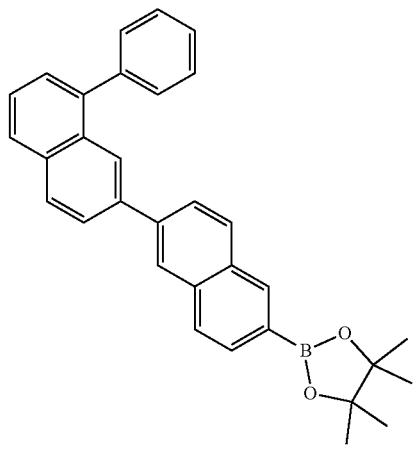
Sub1-34
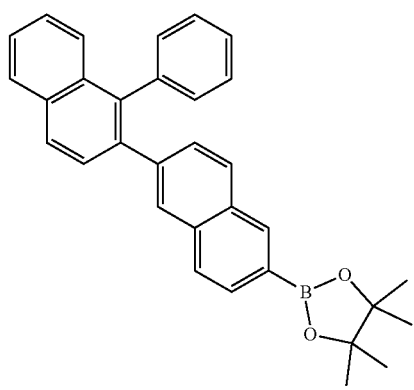

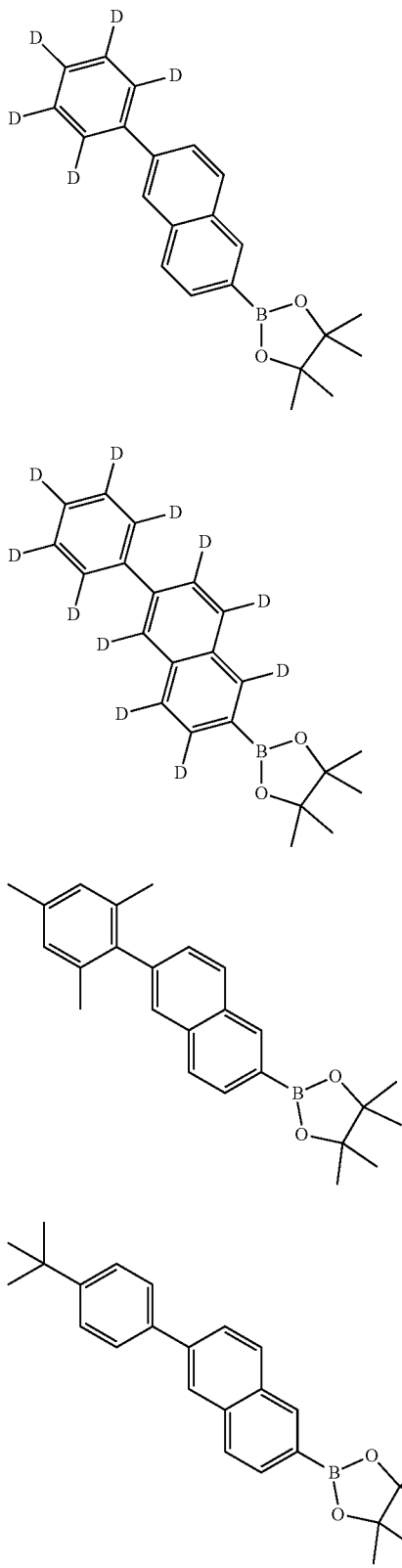

Sub1-35

Sub1-36

Sub1-37

Sub1-38

TABLE 2

| Compound | FD-MS |
|---|---|
| Sub 1-1 | m/z = 330.18 ($C_{22}H_{23}BO_2$ = 330.23) |
| Sub 1-2 | m/z = 406.21 ($C_{28}H_{27}BO_2$ = 406.33) |
| Sub 1-3 | m/z = 406.21 ($C_{28}H_{27}BO_2$ = 406.33) |
| Sub 1-4 | m/z = 406.21 ($C_{28}H_{27}BO_2$ = 406.33) |
| Sub 1-5 | m/z = 380.19 ($C_{26}H_{25}BO_2$ = 380.29) |
| Sub 1-6 | m/z = 380.19 ($C_{26}H_{25}BO_2$ = 380.29) |
| Sub 1-7 | m/z = 482.24 ($C_{34}H_{31}BO_2$ = 482.43) |
| Sub 1-8 | m/z = 482.24 ($C_{34}H_{31}BO_2$ = 482.43) |
| Sub 1-9 | m/z = 482.24 ($C_{34}H_{31}BO_2$ = 482.43) |
| Sub 1-10 | m/z = 482.24 ($C_{34}H_{31}BO_2$ = 482.43) |
| Sub 1-11 | m/z = 482.24 ($C_{34}H_{31}BO_2$ = 482.43) |
| Sub 1-12 | m/z = 482.24 ($C_{34}H_{31}BO_2$ = 482.43) |
| Sub 1-13 | m/z = 482.24 ($C_{34}H_{31}BO_2$ = 482.43) |
| Sub 1-14 | m/z = 482.24 ($C_{34}H_{31}BO_2$ = 482.43) |
| Sub 1-15 | m/z = 482.24 ($C_{34}H_{31}BO_2$ = 482.43) |
| Sub 1-16 | m/z = 482.24 ($C_{34}H_{31}BO_2$ = 482.43) |
| Sub 1-17 | m/z = 482.24 ($C_{34}H_{31}BO_2$ = 482.43) |
| Sub 1-18 | m/z = 482.24 ($C_{34}H_{31}BO_2$ = 482.43) |
| Sub 1-19 | m/z = 482.24 ($C_{34}H_{31}BO_2$ = 482.43) |
| Sub 1-20 | m/z = 482.24 ($C_{34}H_{31}BO_2$ = 482.43) |
| Sub 1-21 | m/z = 456.23 ($C_{32}H_{29}BO_2$ = 456.39) |
| Sub 1-22 | m/z = 456.23 ($C_{32}H_{29}BO_2$ = 456.39) |
| Sub 1-23 | m/z = 456.23 ($C_{32}H_{29}BO_2$ = 456.39) |
| Sub 1-24 | m/z = 456.23 ($C_{32}H_{29}BO_2$ = 456.39) |
| Sub 1-25 | m/z = 456.23 ($C_{32}H_{29}BO_2$ = 456.39) |
| Sub 1-26 | m/z = 456.23 ($C_{32}H_{29}BO_2$ = 456.39) |
| Sub 1-27 | m/z = 456.23 ($C_{32}H_{29}BO_2$ = 456.39) |
| Sub 1-28 | m/z = 456.23 ($C_{32}H_{29}BO_2$ = 456.39) |
| Sub 1-29 | m/z = 456.23 ($C_{32}H_{29}BO_2$ = 456.39) |
| Sub 1-30 | m/z = 456.23 ($C_{32}H_{29}BO_2$ = 456.39) |
| Sub 1-31 | m/z = 456.23 ($C_{32}H_{29}BO_2$ = 456.39) |
| Sub 1-32 | m/z = 456.23 ($C_{32}H_{29}BO_2$ = 456.39) |
| Sub 1-33 | m/z = 456.23 ($C_{32}H_{29}BO_2$ = 456.39) |
| Sub 1-34 | m/z = 456.23 ($C_{32}H_{29}BO_2$ = 456.39) |
| Sub 1-35 | m/z = 335.21 ($C_{22}H_{18}D_5BO_2$ = 335.26) |
| Sub 1-36 | m/z = 341.25 ($C_{22}H_{12}D_{11}BO_2$ = 341.3) |
| Sub 1-37 | m/z = 372.23 ($C_{25}H_{29}BO_2$ = 372.32) |
| Sub 1-38 | m/z = 386.24 ($C_{26}H_{31}BO_2$ = 386.34) |

Meanwhile, the compound belonging to Sub 2 may be the following compounds, but is not limited thereto, and Table 2 below shows FD-MS values of the compounds belonging to Sub 2.

Sub2-1

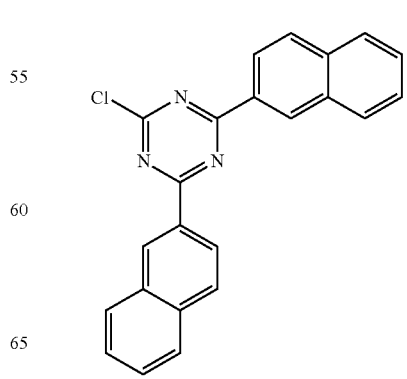

Sub2-2
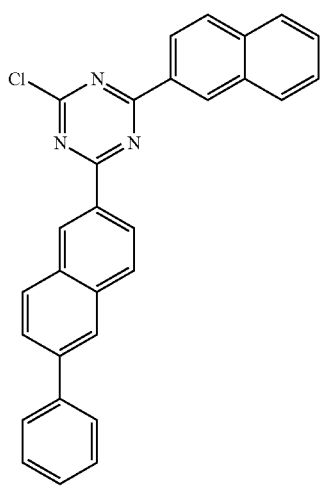
Sub2-3
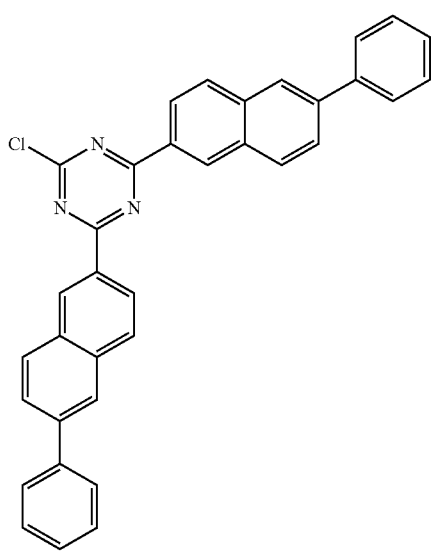
Sub2-4
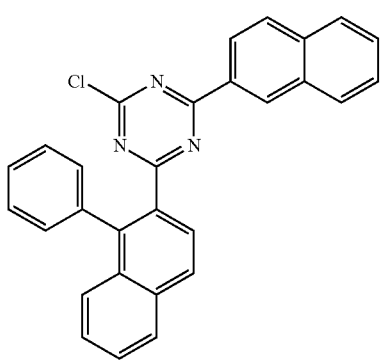
Sub2-5
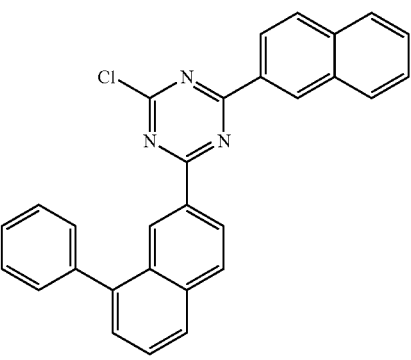
Sub2-6
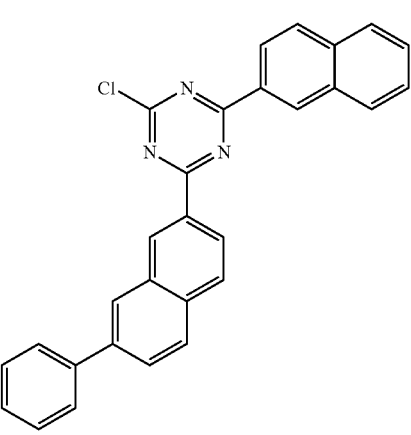
Sub2-7
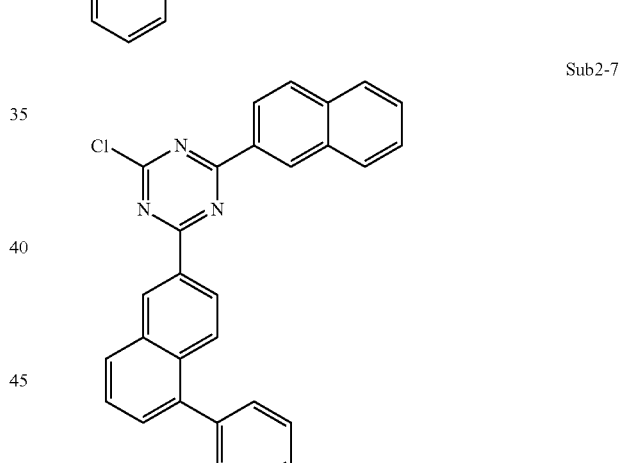
Sub2-8
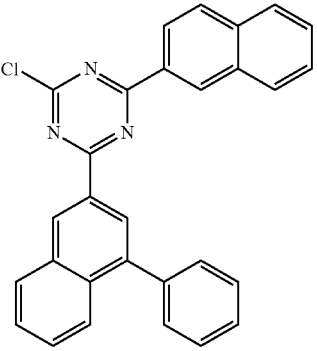

-continued
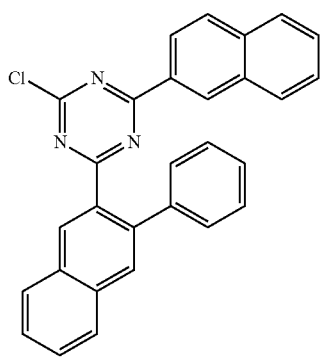
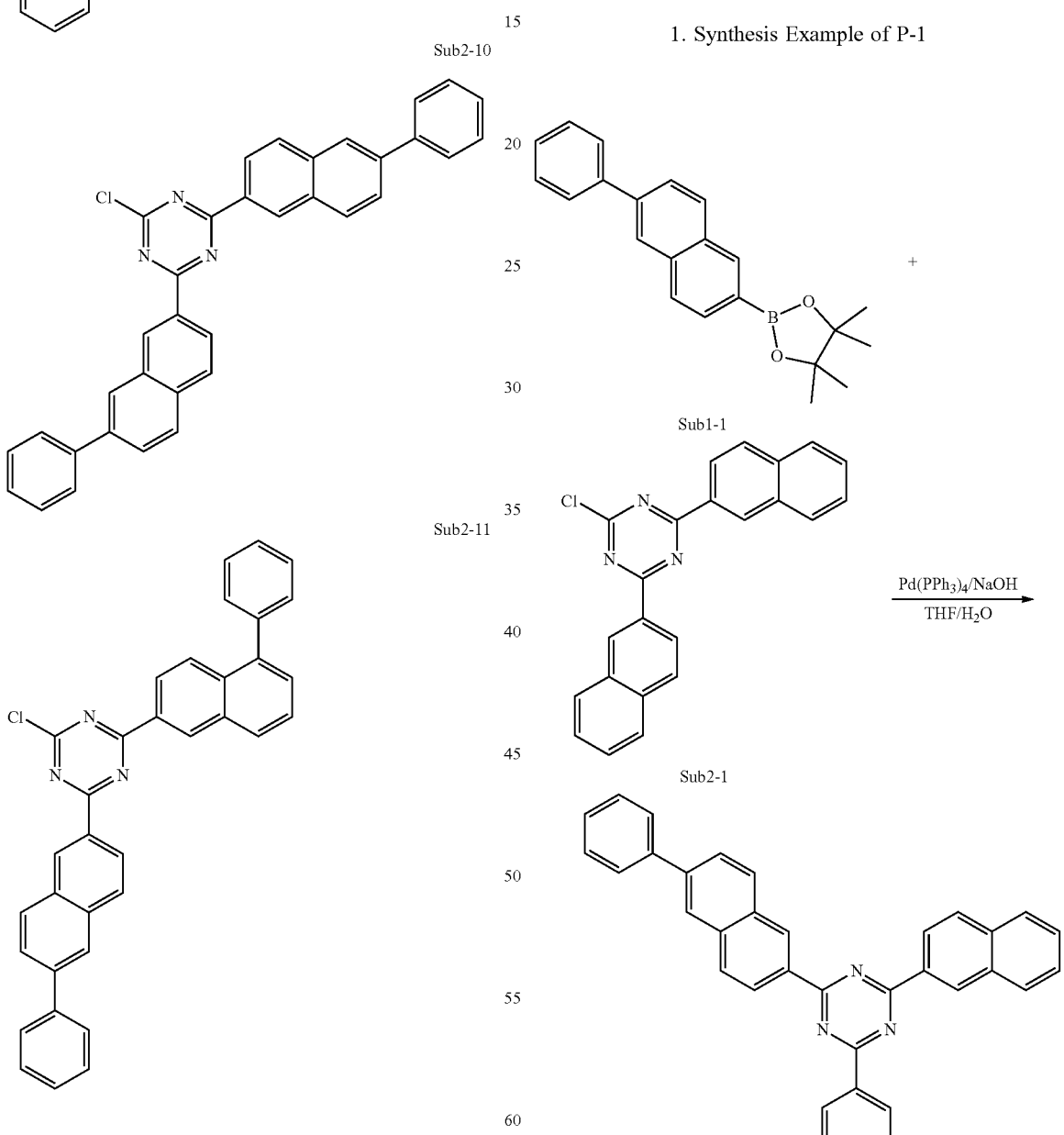
TABLE
| compound | FD-MS |
| --- | --- |
| Sub 2-1 | m/z = 367.09 ($C_{23}H_{14}ClN_3$ = 367.84) |
| Sub 2-2 | m/z = 443.12 ($C_{29}H_{18}ClN_3$ = 443.93) |
TABLE-continued
| compound | FD-MS |
| --- | --- |
| Sub 2-3 | m/z = 519.15 ($C_{35}H_{22}ClN_3$ = 520.03) |
| Sub 2-4 | m/z = 443.12 ($C_{29}H_{18}ClN_3$ = 443.93) |
| Sub 2-5 | m/z = 443.12 ($C_{29}H_{18}ClN_3$ = 443.93) |
| Sub 2-6 | m/z = 443.12 ($C_{29}H_{18}ClN_3$ = 443.93) |
| Sub 2-7 | m/z = 443.12 ($C_{29}H_{18}ClN_3$ = 443.93) |
| Sub 2-8 | m/z = 443.12 ($C_{29}H_{18}ClN_3$ = 443.93) |
| Sub 2-9 | m/z = 443.12 ($C_{29}H_{18}ClN_3$ = 443.93) |
| Sub 2-10 | m/z = 519.15 ($C_{35}H_{22}ClN_3$ = 520.03) |
| Sub 2-11 | m/z = 519.15 ($C_{35}H_{22}ClN_3$ = 520.03) |
II. Synthesis of Product
1. Synthesis Example of P-1

Sub 1-1 (10 g, 0.03 mol), Sub 2-1 (11.1 g, 0.03 mol), Pd(PPh$_3$)$_4$ (0.9 g, 0.001 mol), NaOH (3.3 g, 0.08 mol), THF (54 mL) and water (17 mL) were added, and the reaction was carried out at 70° C. for 6 hours. When the reaction is completed, the temperature of the reactant is cooled to room temperature, and the solvent is removed. Then, the concentrated reactant was separated using a silica gel column or recrystallization method to obtain 12 g (82.3%) of product P-1.

2. Synthesis Example of P-5

Sub 1-5 (10 g, 0.03 mol), Sub 2-1 (9.7 g, 0.03 mol), Pd(PPh$_3$)$_4$ (0.9 g, 0.001 mol), NaOH (3.2 g, 0.08 mol), THF (52 mL) and water (15 mL) were added, and the reaction was carried out at 70° C. for 6 hours. When the reaction was completed, 13 g (84.4%) of the product P-5 was obtained by using the separation method for P-1.

3. Synthesis Example of P-15

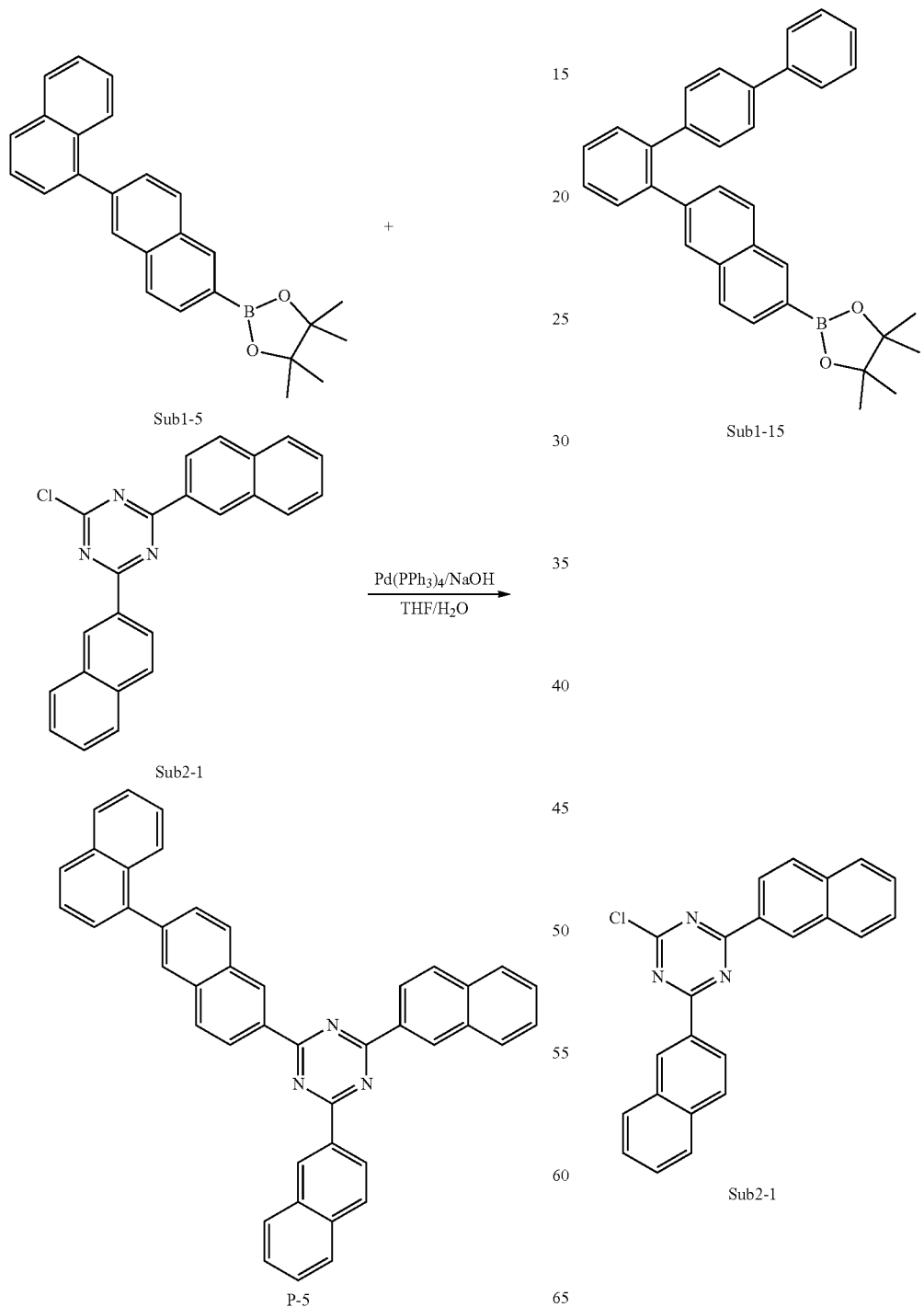

-continued

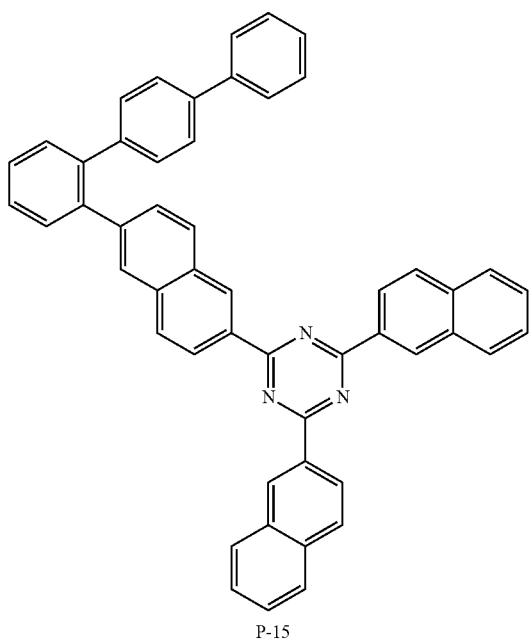

P-15

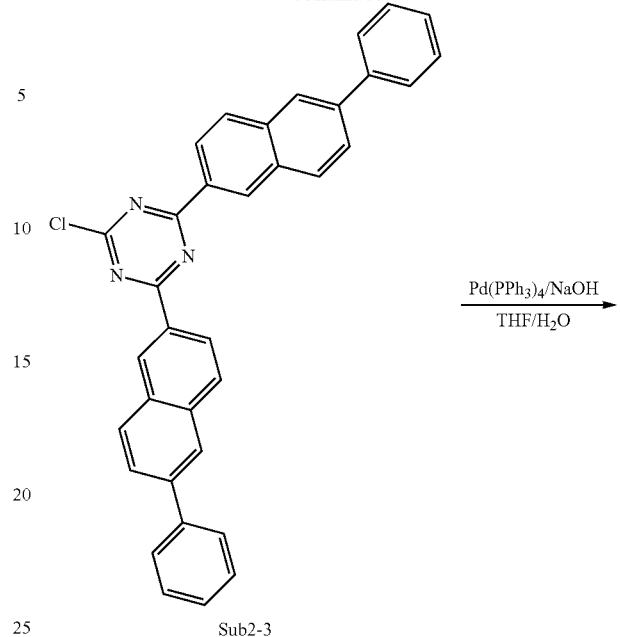

Sub2-3

Sub 1-15 (20 g, 0.04 mol), Sub 2-1 (15.2 g, 0.04 mol), Pd(PPh$_3$)$_4$ (1.4 g, 0.001 mol), NaOH (5 g, 0.12 mol), THF (85 mL) and water (23 mL) were added, and the reaction was carried out at 70° C. for 6 hours. When the reaction was completed, 25 g (88.1%) of the product P-15 was obtained by using the separation method for P-1.

4. Synthesis Example of P-36

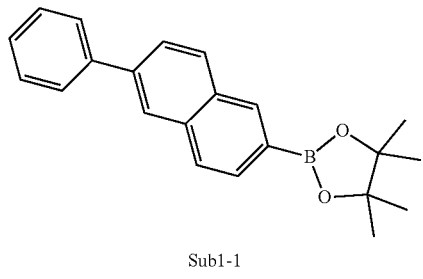

Sub1-1

+

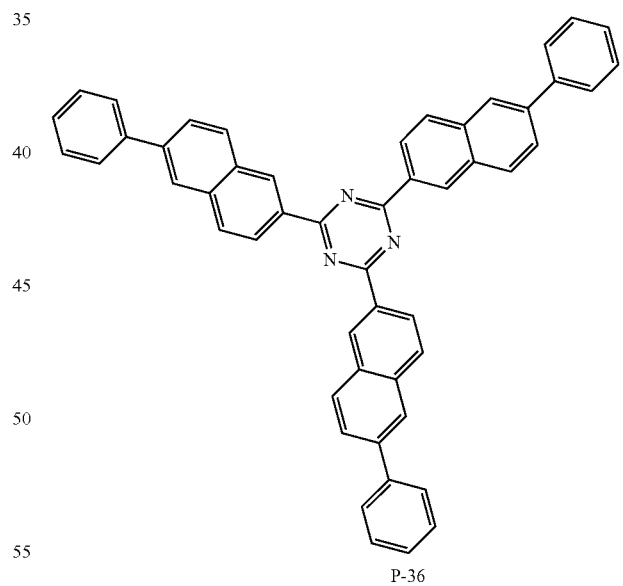

P-36

Sub 1-1 (15 g, 0.05 mol), Sub 2-3 (23.6 g, 0.05 mol), Pd(PPh$_3$)$_4$ (1.6 g, 0.001 mol), NaOH (5.5 g, 0.14 mol), THF (90 mL) and water (30 mL) were added, and the reaction was carried out at 70° C. for 6 hours. When the reaction was completed, 25 g (80.1%) of the product P-36 was obtained by using the separation method for P-1.

5. Synthesis Example of P-46

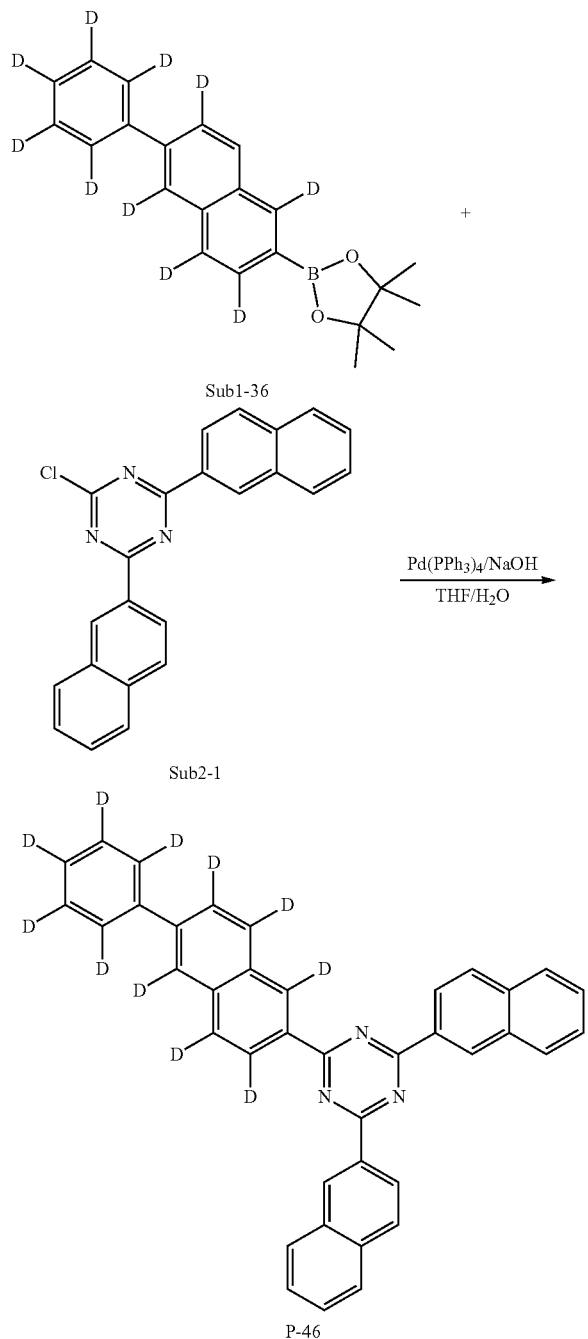

Sub 1-36 (15 g, 0.04 mol), Sub 2-1 (16.1 g, 0.04 mol), Pd(PPh$_3$)$_4$ (1.5 g, 0.001 mol), NaOH (5.3 g, 0.13 mol), THF (90 mL) and water (30 mL) were added, and the reaction was carried out at 70° C. for 6 hours. When the reaction was completed, 19 g (79.1%) of the product P-46 was obtained by using the separation method for P-1.

Meanwhile, the FD-MS values of the compounds P-1 to P-50 of the present invention prepared according to the above synthesis examples are shown in Table.

TABLE 3

| compound | FD-MS |
|---|---|
| P-1 | m/z = 535.2 (C$_{39}$H$_{25}$N$_3$ = 535.65) |
| P-2 | m/z = 611.24 (C$_{45}$H$_{29}$N$_3$ = 611.75) |
| P-3 | m/z = 611.24 (C$_{45}$H$_{29}$N$_3$ = 611.75) |
| P-4 | m/z = 611.24 (C$_{45}$H$_{29}$N$_3$ = 611.75) |
| P-5 | m/z = 585.22 (C$_{43}$H$_{27}$N$_3$ = 585.71) |
| P-6 | m/z = 585.22 (C$_{43}$H$_{27}$N$_3$ = 585.71) |
| P-7 | m/z = 687.27 (C$_{51}$H$_{33}$N$_3$ = 687.85) |
| P-8 | m/z = 687.27 (C$_{51}$H$_{33}$N$_3$ = 687.85) |
| P-9 | m/z = 687.27 (C$_{51}$H$_{33}$N$_3$ = 687.85) |
| P-10 | m/z = 687.27 (C$_{51}$H$_{33}$N$_3$ = 687.85) |
| P-11 | m/z = 687.27 (C$_{51}$H$_{33}$N$_3$ = 687.85) |
| P-12 | m/z = 687.27 (C$_{51}$H$_{33}$N$_3$ = 687.85) |
| P-13 | m/z = 687.27 (C$_{51}$H$_{33}$N$_3$ = 687.85) |
| P-14 | m/z = 687.27 (C$_{51}$H$_{33}$N$_3$ = 687.85) |
| P-15 | m/z = 687.27 (C$_{51}$H$_{33}$N$_3$ = 687.85) |
| P-16 | m/z = 687.27 (C$_{51}$H$_{33}$N$_3$ = 687.85) |
| P-17 | m/z = 687.27 (C$_{51}$H$_{33}$N$_3$ = 687.85) |
| P-18 | m/z = 687.27 (C$_{51}$H$_{33}$N$_3$ = 687.85) |
| P-19 | m/z = 687.27 (C$_{51}$H$_{33}$N$_3$ = 687.85) |
| P-20 | m/z = 687.27 (C$_{51}$H$_{33}$N$_3$ = 687.85) |
| P-21 | m/z = 661.25 (C$_{49}$H$_{31}$N$_3$ = 661.81) |
| P-22 | m/z = 661.25 (C$_{49}$H$_{31}$N$_3$ = 661.81) |
| P-23 | m/z = 661.25 (C$_{49}$H$_{31}$N$_3$ = 661.81) |
| P-24 | m/z = 661.25 (C$_{49}$H$_{31}$N$_3$ = 661.81) |
| P-25 | m/z = 661.25 (C$_{49}$H$_{31}$N$_3$ = 661.81) |
| P-26 | m/z = 661.25 (C$_{49}$H$_{31}$N$_3$ = 661.81) |
| P-27 | m/z = 661.25 (C$_{49}$H$_{31}$N$_3$ = 661.81) |
| P-28 | m/z = 661.25 (C$_{49}$H$_{31}$N$_3$ = 661.81) |
| P-29 | m/z = 661.25 (C$_{49}$H$_{31}$N$_3$ = 661.81) |
| P-30 | m/z = 661.25 (C$_{49}$H$_{31}$N$_3$ = 661.81) |
| P-31 | m/z = 661.25 (C$_{49}$H$_{31}$N$_3$ = 661.81) |
| P-32 | m/z = 661.25 (C$_{49}$H$_{31}$N$_3$ = 661.81) |
| P-33 | m/z = 661.25 (C$_{49}$H$_{31}$N$_3$ = 661.81) |
| P-34 | m/z = 661.25 (C$_{49}$H$_{31}$N$_3$ = 661.81) |
| P-35 | m/z = 611.24 (C$_{45}$H$_{29}$N$_3$ = 611.75) |
| P-36 | m/z = 687.27 (C$_{51}$H$_{33}$N$_3$ = 687.85) |
| P-37 | m/z = 611.24 (C$_{45}$H$_{29}$N$_3$ = 611.75) |
| P-38 | m/z = 611.24 (C$_{45}$H$_{29}$N$_3$ = 611.75) |
| P-39 | m/z = 611.24 (C$_{45}$H$_{29}$N$_3$ = 611.75) |
| P-40 | m/z = 611.24 (C$_{45}$H$_{29}$N$_3$ = 611.75) |
| P-41 | m/z = 611.24 (C$_{45}$H$_{29}$N$_3$ = 611.75) |
| P-42 | m/z = 611.24 (C$_{45}$H$_{29}$N$_3$ = 611.75) |
| P-43 | m/z = 687.27 (C$_{51}$H$_{33}$N$_3$ = 687.85) |
| P-44 | m/z = 687.27 (C$_{51}$H$_{33}$N$_3$ = 687.85) |
| P-45 | m/z = 540.24 (C$_{39}$H$_{20}$D$_5$N$_3$ = 540.68) |
| P-46 | m/z = 546.27 (C$_{39}$H$_{14}$D$_{11}$N$_3$ = 546.72) |
| P-47 | m/z = 621.3 (C$_{45}$H$_{19}$D$_{10}$N$_3$ = 621.81) |
| P-48 | m/z = 627.34 (C$_{45}$H$_{13}$D$_{16}$N$_3$ = 627.85) |
| P-49 | m/z = 577.25 (C$_{42}$H$_{31}$N$_3$ = 577.73) |
| P-50 | m/z = 591.27 (C$_{43}$H$_{33}$N$_3$ = 591.76) |

Reorganization energy (hereinafter, abbreviated as RE) refers to energy lost due to a change in molecular structure arrangement when electric charges (electrons, holes) move. It depends on molecular geometry, and has a characteristic that the value decreases as the difference between the potential energy surface (hereinafter, abbreviated as PES) in the neutral state and the PES in the charge state decreases. The RE value can be obtained by the following formula.

$$RE_{hole}: \lambda^+ = (E_{NOCE} - E_{COCE}) + (E_{CONE} - E_{NONE})$$

$$RE_{elec}: \lambda^- = (E_{AOAE} - E_{AOAE}) + (E_{AONE} - E_{NONE})$$

Each factor can be defined as follows.
NONE: Neutral geometry of neutral molecules (hereinafter, NO opt.)
NOAE: Anion geometry of a neutral molecule
NOCE: Cation geometry of a neutral molecule
AONE: Neutral geometry of anion molecule
AOAE: Anion geometry of anion molecule (hereinafter, AO opt.)
CONE: Neutral geometry of cation molecule
COCE: Cation geometry of cation molecule (hereinafter, CO opt.)

Reorganization energy and mobility are in inverse proportion to each other, and under the condition that they have the same r and T values, the RE value directly affects mobility for each material. The relation between RE value and mobility is expressed as follows.

$$\mu = k \frac{r^2}{2k_B T/e}$$

$$k = \left(\frac{4\pi^2}{h}\right)\frac{t^2}{\sqrt{4\pi\lambda k_B T}} \exp\left[-\frac{\lambda}{4k_B T}\right]$$

Each factor can be defined as follows.
λ: Reorganization energy
μ: mobility
r: dimer displacement
t: intermolecular charge transfer matrix element From the above formula, it can be seen that the lower the RE value, the faster the mobility.

The RE value requires a simulation tool that can calculate the potential energy according to the molecular structure, and we used Gaussian09 (hereafter, G09) and the Jaguar (hereafter, JG) module of Schrodinger Materials Science. Both G09 and JG are tools to analyze the properties of molecules through quantum mechanical (hereafter, QM) calculations, and have the function of optimizing the molecular structure or calculating the energy for a given molecular structure (single-point energy).

The process of calculating QM in molecular structure requires large computational resources, and we use two cluster servers for these calculations. Each cluster server consists of 4 node workstations and 1 master workstation, and each node performed molecular QM calculations by parallel computing through symmetric multi-processing (SMP) using a central processing unit (CPU) of 36 or more cores.

Using G09, calculate the optimized molecular structure and its potential energy (NONE/COCE) in the neutral/charged state required for rearrangement energy. The charge state potential energy (NOCE) of the structure optimized for the neutral state and the neutral state potential energy (CONE) of the structure optimized for the charge state were calculated by changing only the charges to the two optimized structures. Then, the rearrangement energy was calculated according to the following relation.

$$RE_{charge}: \lambda = (E_{NOCE} - E_{COCE}) + (E_{CONE} - E_{NONE})$$

Because Schrödinger provides a function to automatically perform such a calculation process, the potential energy according to each state was sequentially calculated through the JG module by providing the molecular structure (NO) of the basic state, and the RE value was calculated.

Meanwhile, the RE values of the present invention calculated according to the above calculation method are shown in Table 4 below.

TABLE 4

| compound | Reorganization energy (RE) |
| --- | --- |
| P-1 | 0.1704 |
| P-2 | 0.1721 |
| P-3 | 0.1842 |
| P-4 | 0.2043 |
| P-5 | 0.2148 |
| P-6 | 0.2200 |
| P-10 | 0.1697 |
| P-36 | 0.1687 |

Otherwise, the RE values of the comparative compounds calculated according to the calculation method as described above are shown in Table 5 below.

TABLE 5

| compound | Reorganization energy (RE) |
| --- | --- |
| comparative compound A | 0.1531 |
| comparative compound B | 0.2271 |
| comparative compound C | 0.2278 |
| comparative compound D | 0.2657 |
| comparative compound E | 0.2879 |
| comparative compound F | 0.2930 |
| comparative compound G | 0.2943 |
| comparative compound H | 0.2962 |

[Example 1] Red Organic Light Emitting Device (Phosphorescent Host)

An organic electroluminescent device was manufactured according to a conventional method by using the compound obtained through synthesis as a light emitting host material of the emitting layer. First, a N1-(naphthalen-2-yl)-N4,N4-bis(4-(naphthalen-2-yl(phenyl)amino)phenyl)-N1-phenylbenzene-1,4-diamine (abbreviated as 2-TNATA) film was vacuum-deposited on the ITO layer (anode) formed on a glass substrate to form a 60 nm-thick hole injection layer, and 4,4-bis[N-(1-naphthyl)-N-phenylamino]biphenyl (hereinafter abbreviated as -NPD) as a hole transport compound on the hole injection layer was vacuum-deposited to a thickness of 60 nm to form a hole transport layer.

As a host on the hole transport layer, the compound (P-1) of the present invention represented by Formula 1 and DSNL-1 were used in a weight ratio of 5:5, and (piq)$_2$Ir(acac)[bis-(1-phenylisoquinolyl)iridium(III)acetylacetonate] as a dopant material was doped at a weight ratio of 95:5 to deposit an emitting layer to a thickness of 30 nm). Subsequently, (1,1'-bisphenyl)-4-oleato)bis(2-methyl-8-quinolineoleato)aluminum (abbreviated as BAlq) as a hole-blocking layer was vacuum-deposited to a thickness of 10 nm, and as an electron transport layer, tris(8-quinolinol)aluminum (abbreviated as Alq3) was deposited to a thickness of 40 nm. Then, as an electron injection layer, LiF, an alkali metal halide, was deposited to a thickness of 0.2 nm, and then, Al was deposited to a thickness of 150 nm and used as a cathode to prepare an organic electroluminescent device.

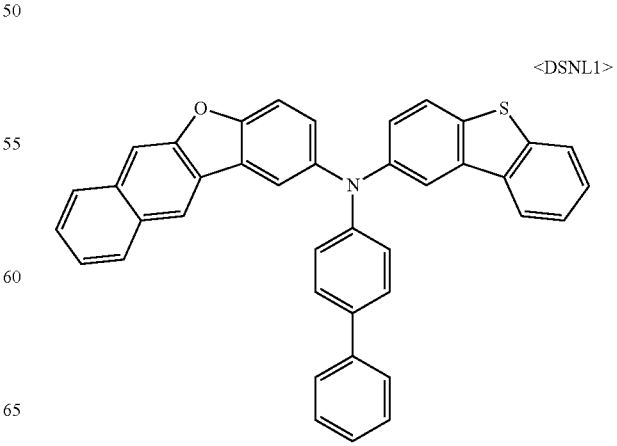

<DSNL1>

<DSNL2>

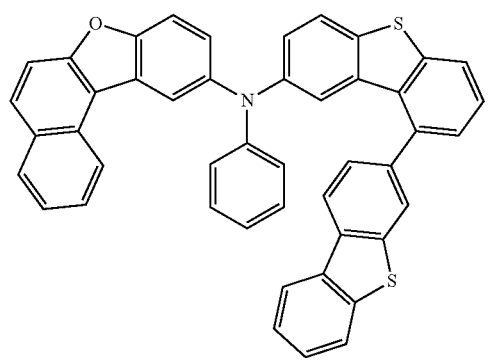

[Example 2] to [Example 22]

An organic electroluminescent device was prepared in the same manner as in Example 1, except that the compound of the present invention shown in Table 6 was used instead of the compound (P-1) of the present invention as the host material of the emitting layer.

[Comparative Example 1] to [Comparative Example 16]

An organic electroluminescent device was manufactured in the same manner as in Example 1, except that the following Comparative Compounds A to H were used as host materials for the emitting layer.

<Comparative Compounds A, B and C>

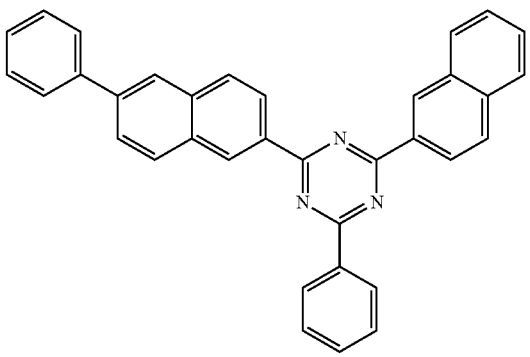

<Comparative Compounds D, E and F>

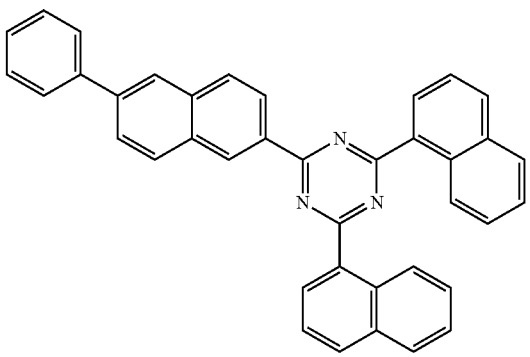

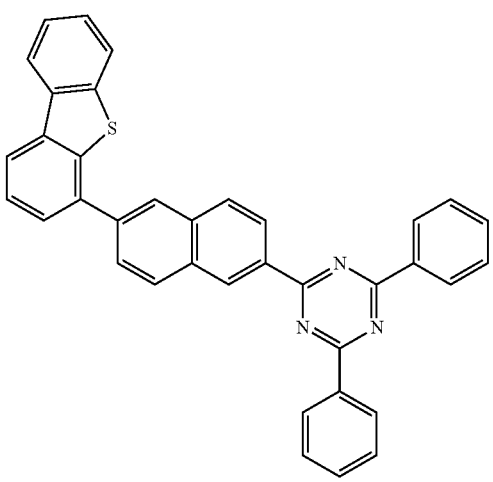

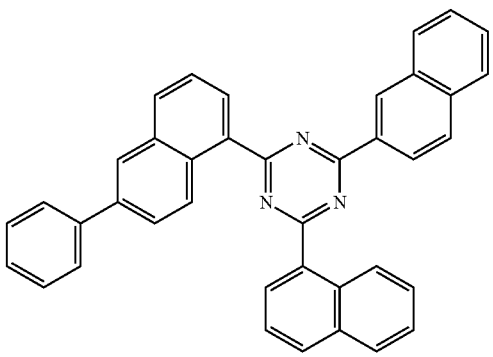

<Comparative Compounds G and H>

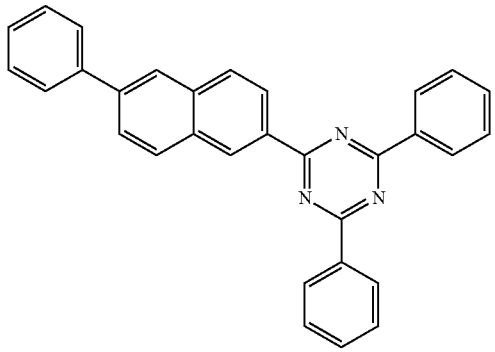

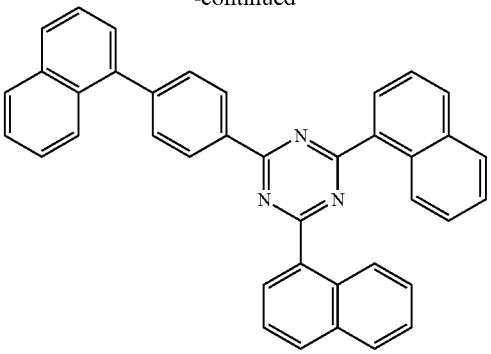

By applying a forward bias DC voltage to the organic electronic devices prepared in Examples 1 to 22 and Comparative Examples 1 to 16 prepared in this way, Electroluminescence (EL) characteristics were measured with PR-650 from photo research, and as a result of the measurement, the T95 lifetime was measured using a lifetime measuring device manufactured by McScience at 2500 cd/m² standard luminance. Table 6 below shows the device fabrication and evaluation results.

TABLE 6

| | first compound | second compound | Voltage (v) | Current Density (mA/cm²) | Brightness (cd/m²) | Efficiency (cd/A) | T(95) |
|---|---|---|---|---|---|---|---|
| comparative example(1) | DSNL1 | comparative compound A | 4.9 | 17.1 | 2500 | 14.6 | 101.1 |
| comparative example(2) | | comparative compound B | 5.2 | 12.8 | 2500 | 19.5 | 107.4 |
| comparative example(3) | | comparative compound C | 5.1 | 12.6 | 2500 | 19.8 | 110.0 |
| comparative example(4) | | comparative compound D | 5.2 | 13.7 | 2500 | 18.2 | 106.1 |
| comparative example(5) | | comparative compound E | 5.4 | 14.0 | 2500 | 17.9 | 102.4 |
| comparative example(6) | | comparative compound F | 5.6 | 13.7 | 2500 | 18.2 | 103.6 |
| comparative example(7) | | comparative compound G | 5.3 | 13.0 | 2500 | 19.3 | 108.7 |
| comparative example(8) | | comparative compound H | 5.3 | 13.5 | 2500 | 18.5 | 104.5 |
| comparative example(9) | DSNL2 | comparative compound A | 4.7 | 16.6 | 2500 | 15.1 | 100.8 |
| comparative example(10) | | comparative compound B | 5.1 | 12.3 | 2500 | 20.4 | 105.7 |
| comparative example(11) | | comparative compound C | 5.2 | 12.0 | 2500 | 20.8 | 106.6 |
| comparative example(12) | | comparative compound D | 5.0 | 12.9 | 2500 | 19.4 | 104.7 |
| comparative example(13) | | comparative compound E | 5.5 | 14.8 | 2500 | 16.9 | 101.0 |
| comparative example(14) | | comparative compound F | 5.6 | 13.0 | 2500 | 19.2 | 103.2 |
| comparative example(15) | | comparative compound G | 5.2 | 12.3 | 2500 | 20.3 | 106.0 |
| comparative example(16) | | comparative compound H | 5.1 | 12.7 | 2500 | 19.7 | 101.4 |
| example(1) | DSNL1 | P-1 | 4.5 | 8.3 | 2500 | 30.1 | 143.9 |
| example(2) | | P-2 | 4.7 | 8.8 | 2500 | 28.3 | 140.0 |
| example(3) | | P-3 | 4.8 | 9.2 | 2500 | 27.2 | 137.2 |
| example(4) | | P-4 | 4.7 | 9.4 | 2500 | 26.7 | 141.1 |
| example(5) | | P-5 | 4.7 | 9.0 | 2500 | 27.7 | 138.5 |
| example(6) | | P-6 | 4.8 | 9.9 | 2500 | 25.2 | 135.9 |
| example(7) | | P-10 | 4.6 | 9.7 | 2500 | 25.7 | 134.5 |
| example(8) | | P-36 | 4.7 | 9.5 | 2500 | 26.2 | 142.8 |
| example(9) | | P-39 | 4.8 | 10.1 | 2500 | 24.7 | 131.3 |
| example(10) | | P-46 | 4.6 | 8.7 | 2500 | 28.8 | 145.7 |
| example(11) | | P-50 | 4.7 | 8.5 | 2500 | 29.3 | 133.2 |

TABLE 6-continued

| | first compound | second compound | Voltage (v) | Current Density (mA/cm²) | Brightness (cd/m²) | Efficiency (cd/A) | T(95) |
|---|---|---|---|---|---|---|---|
| example(12) | DSNL2 | P-1 | 4.4 | 8.2 | 2500 | 30.4 | 143.1 |
| example(13) | | P-2 | 4.6 | 8.8 | 2500 | 28.5 | 139.0 |
| example(14) | | P-3 | 4.5 | 9.1 | 2500 | 27.5 | 136.4 |
| example(15) | | P-4 | 4.6 | 9.3 | 2500 | 27.0 | 140.7 |
| example(16) | | P-5 | 4.6 | 8.9 | 2500 | 28.0 | 137.7 |
| example(17) | | P-6 | 4.7 | 9.8 | 2500 | 25.5 | 135.0 |
| example(18) | | P-10 | 4.5 | 9.6 | 2500 | 26.0 | 133.1 |
| example(19) | | P-36 | 4.6 | 9.4 | 2500 | 26.5 | 141.5 |
| example(20) | | P-39 | 4.7 | 10.0 | 2500 | 24.9 | 131.0 |
| example(21) | | P-46 | 4.5 | 8.6 | 2500 | 29.1 | 144.8 |
| example(22) | | P-50 | 4.6 | 8.5 | 2500 | 29.6 | 132.2 |

As can be seen from the results in Table 6, when the compound of the present invention is used as a material for the emitting layer, it can be seen that the driving voltage is lowered and the efficiency and lifespan are significantly improved compared to the case of using the comparative compounds A to H.

More specifically, the compound of the present invention has a lower RE value than the comparative compound. This RE value is determined to be due to naphthyl 2, which is a component substituted for triazine. Since a low RE value is in inverse proportion to mobility, a low RE value means high mobility, and such mobility means a fast single electronic device (Electron Only Device; hereinafter, EOD). Overall, it can be seen that the compound of the present invention having a fast EOD value has the characteristics of a fast driving voltage, high efficiency, and long life. However, Comparative Compound A has an excessively low RE value and thus a fast EOD value. However, an excessively fast EOD adversely affects the charge balance in the device. As a result, despite having a low RE value, it resulted in low efficiency and low lifespan.

In the case of Comparative Compound E containing a hetero element, it can be seen that the lifespan is significantly lower than that of the simple aryl structure. These factors are considered to be lower in heteroaryl than in aryl in stability to the former.

Looking at the compounds of the present invention, it can be seen that the closer the RE value is to a value of 0.1700 to 0.1900, the more the driving voltage is pulled and the efficiency is increased. When the type of the substituent substituted for triazine is phenyl or naphthyl 1 instead of naphthyl 2, the RE value is formed high, and the RE value determined in this way affects overall device performance. Likewise, it can be seen that the lifetime decreases when the RE value is lower than the RE value of 0.1700. It can be seen that the balance of holes and electrons converges to a value of 0.1700 as an RE value.

When the emitting layer was composed of a plurality of mixtures, the characteristics were different depending on the type of the first compound and the second compound, and the device results tended to be the same between the compound of the present invention and the comparative compound. In the end, it can be seen that the driving, efficiency, and lifespan are determined depending on whether the injection characteristics of holes and electrons into the dopant are readily available. In the present invention, it can be seen that through the relationship between the RE value and mobility, the overall driving reduction effect, efficiency and lifespan increase effect are brought. In addition, it can be seen that the core triazine and No. 2 naphthyl have a positive effect on the overall mobility, acting as a ratio of the holes and the electrons (e.g. energy balance, stability, etc.), showing an overall improved result.

Comparing the example compounds, the RE value is determined according to the type of substituent substituted in the same skeleton, and hole and electron injection and migration characteristics are changed according to the different RE values. Therefore, according to the type of the substituent, the embodiment compounds show different properties from each other.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

What is claimed is:
1. A compound represented by Formula 1:

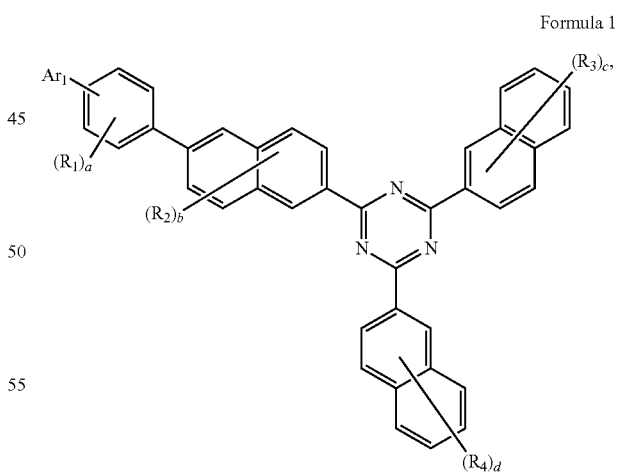

Formula 1 wherein:
1) $Ar_1$ is hydrogen, deuterium, or a $C_6$-$C_{12}$ aryl group;
2) $R_1$ is hydrogen, deuterium, or a $C_6$-$C_{18}$ aryl group, and where a is 2 or more, $R_1$ is in plural being the same or different from each other, and adjacent groups may be bonded to each other to form a $C_6$ ring;
3) $R_2$, $R_3$ and $R_4$ are each independently hydrogen, deuterium, or a $C_6$-$C_{18}$ aryl group, and where b, c, and d are 2 or more, $R_2$, $R_3$ and $R_4$ are each in plural being the same or different from each other;

4) A is an integer of 0 to 4, b is an integer of 0 to 6, c and d are each independently an integer of 0 to 7.

2. The compound of claim 1, wherein a reorganization energy value of the compound is 0.1600 to 0.2200.

3. The compound of claim 1, wherein a reorganization energy value the compound is 0.1600 to 0.2000.

4. The compound of claim 1, wherein a reorganization energy value the compound is 0.1700 to 0.1900.

5. The compound of claim 1, wherein Formula 1 is represented by one of Formula 1-1 to 1-3:

Formula 1-1

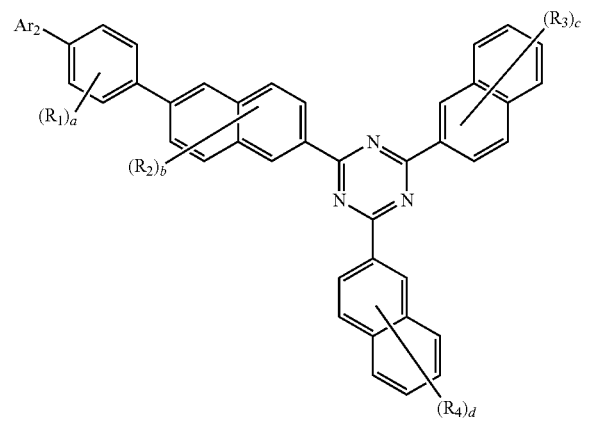

Formula 1-2

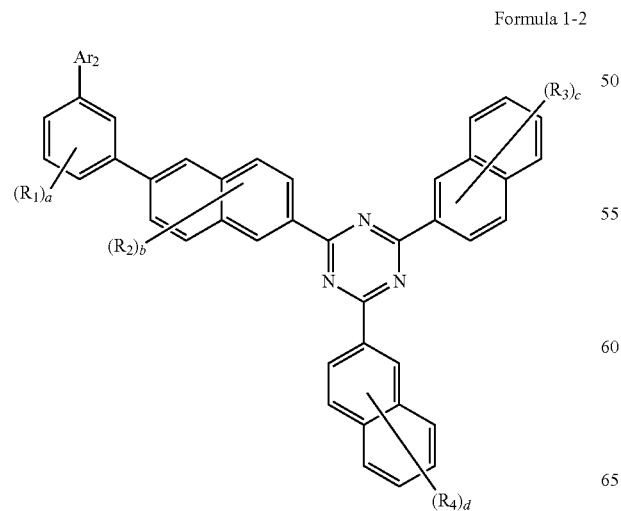

Formula 1-3

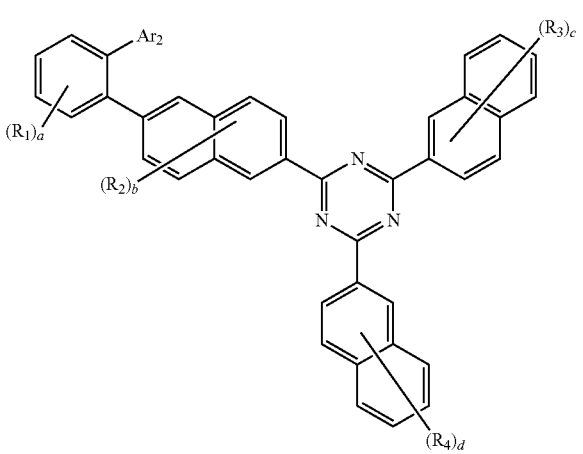

wherein:

1) $R_1$, $R_2$, $R_3$, $R_4$, a, b, c and d are the same as defined in claim 1; and 2) $Ar_2$ are the same as the definition of $Ar_1$ in claim 1.

6. The compound of claim 1, wherein Formula 1 is represented by one of Compounds P-1 to P-23, P-28 to P-29 and P-34 to P-46:

P-1

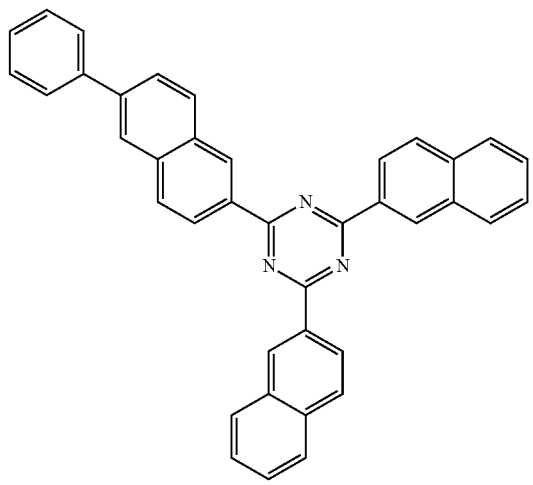

P-2
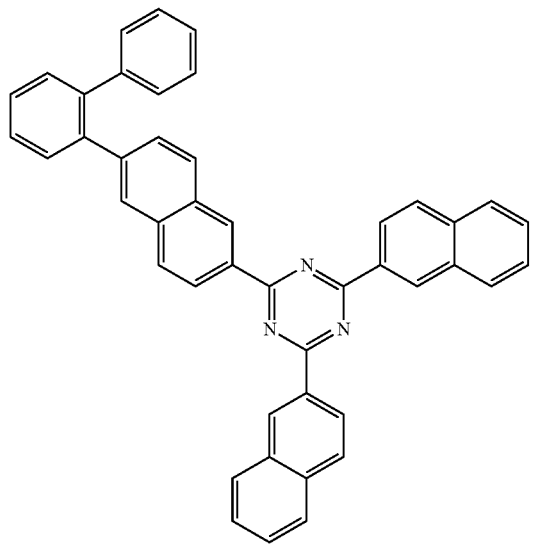
P-3
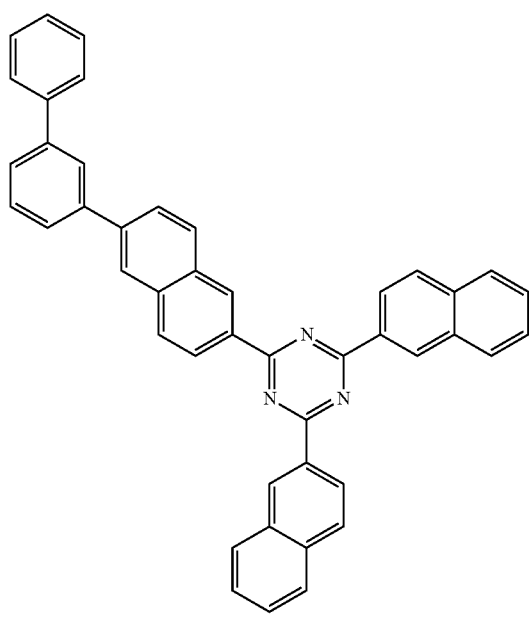
P-4
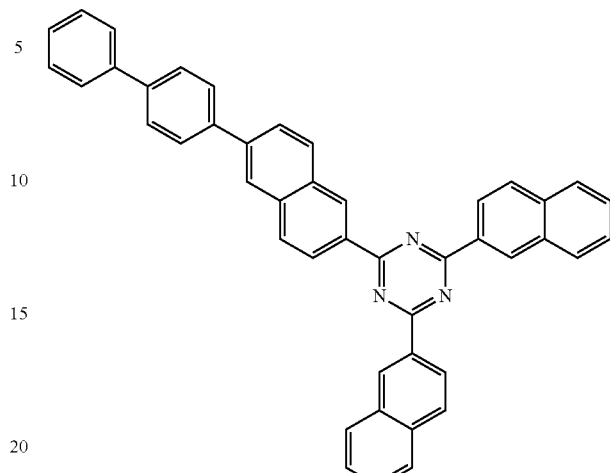
P-5
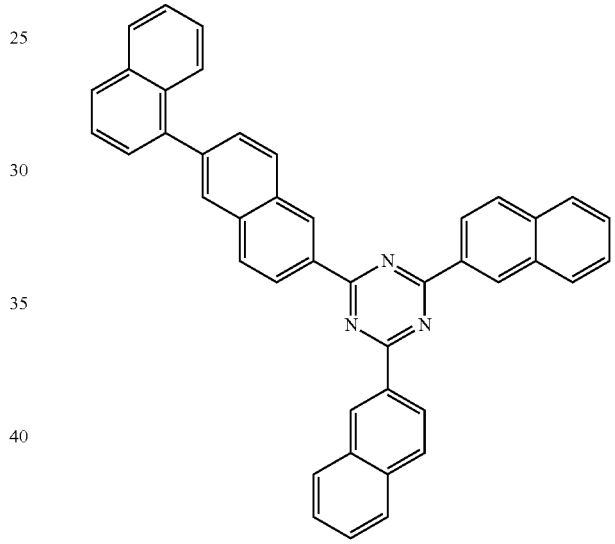
P-6
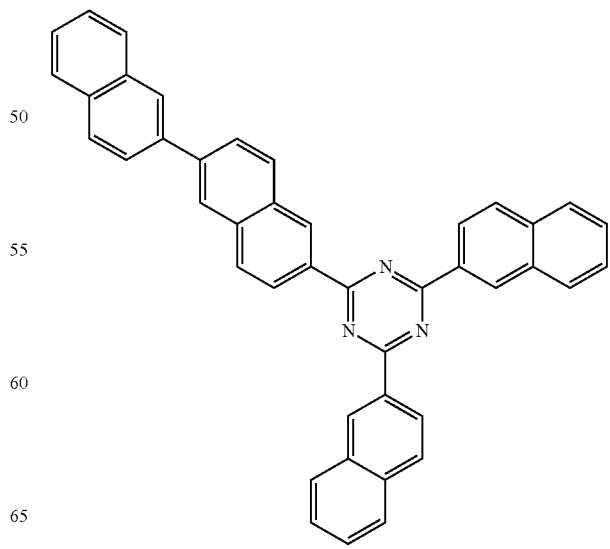

P-7
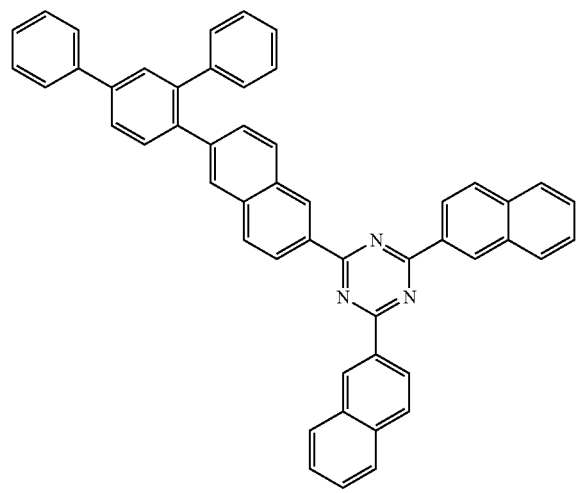
P-8
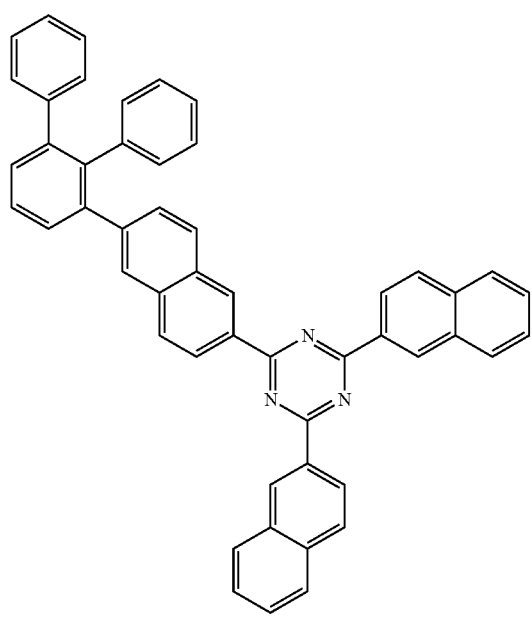
P-9
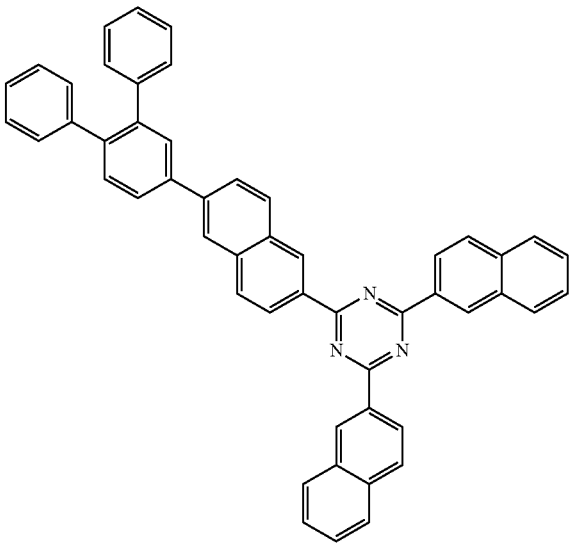
P-10
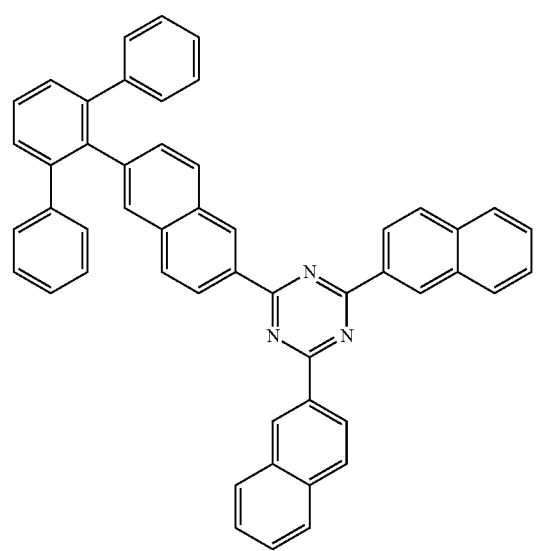

P-11
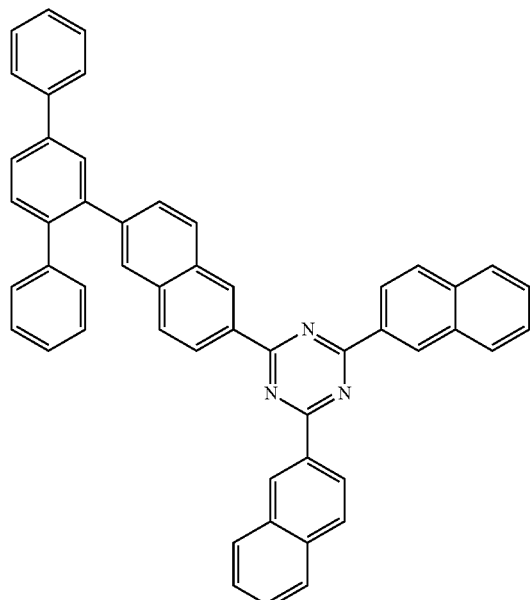
P-12
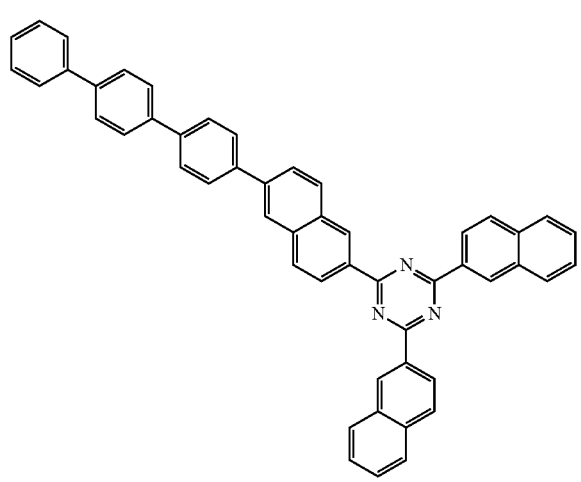
P-13
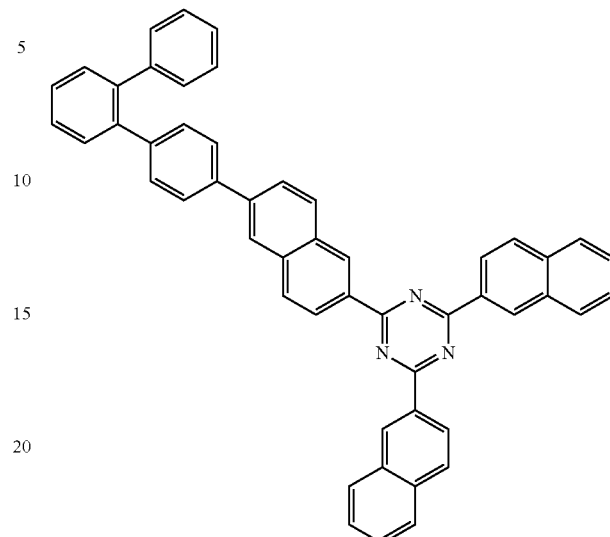
P-14
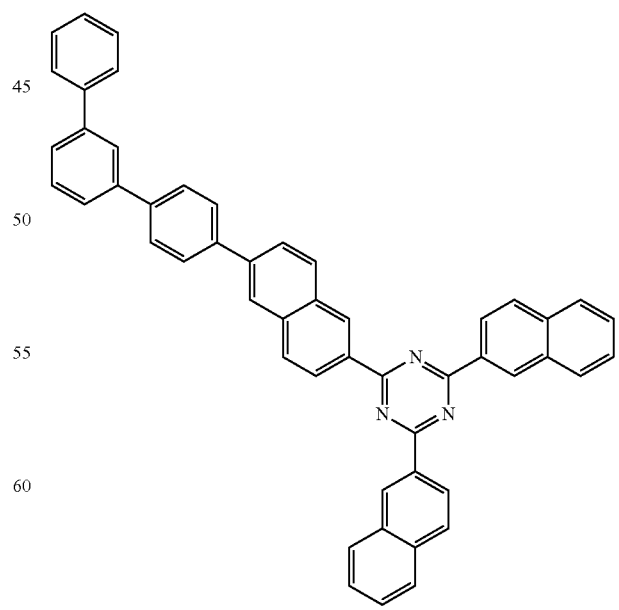

P-15
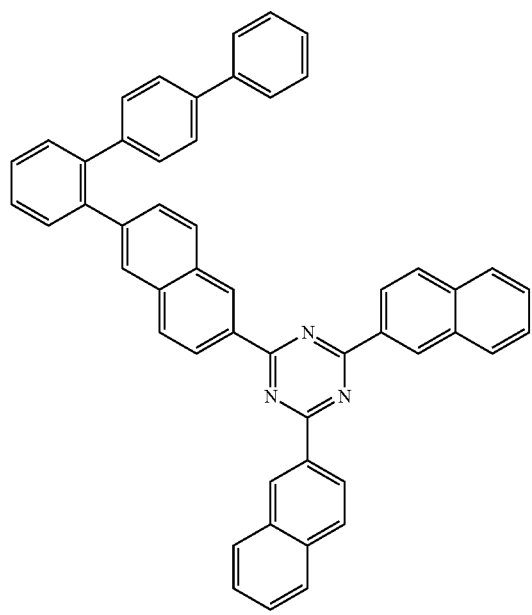
P-17
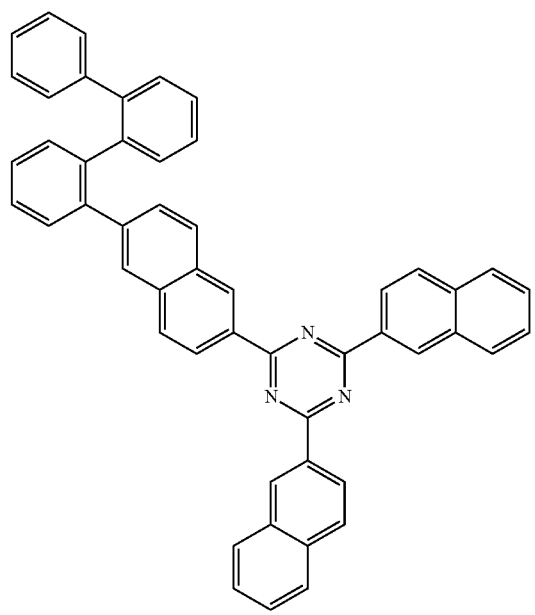
P-16
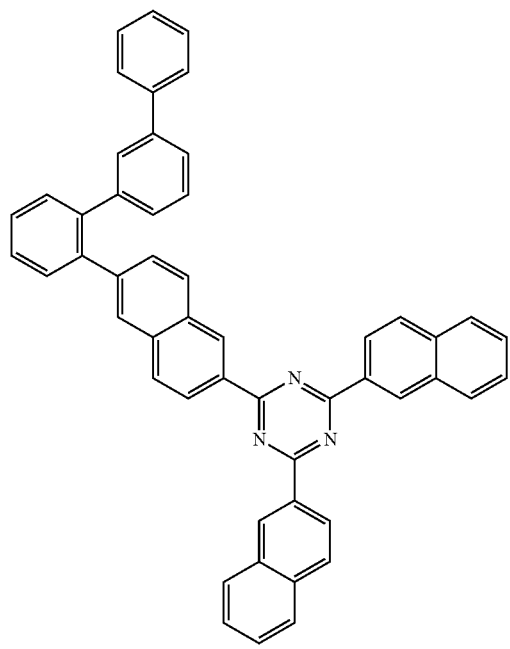
P-18
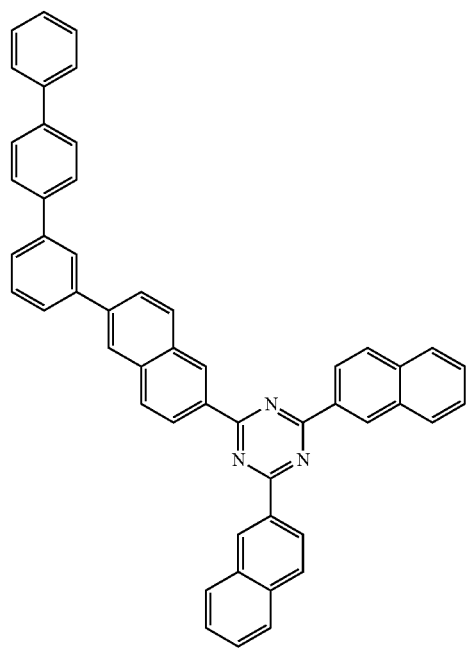

P-19
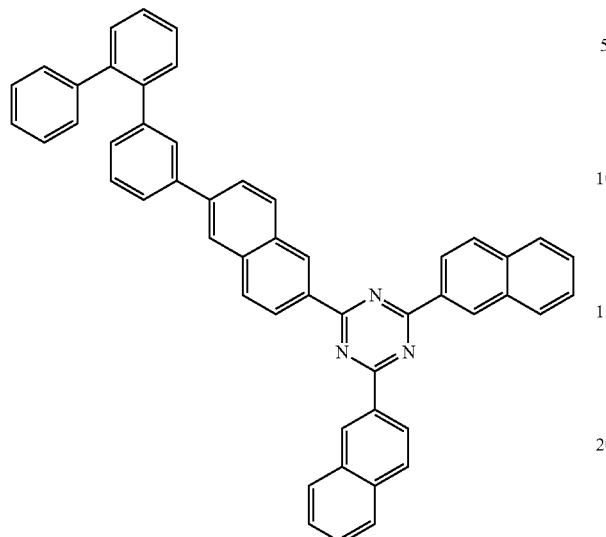
P-20
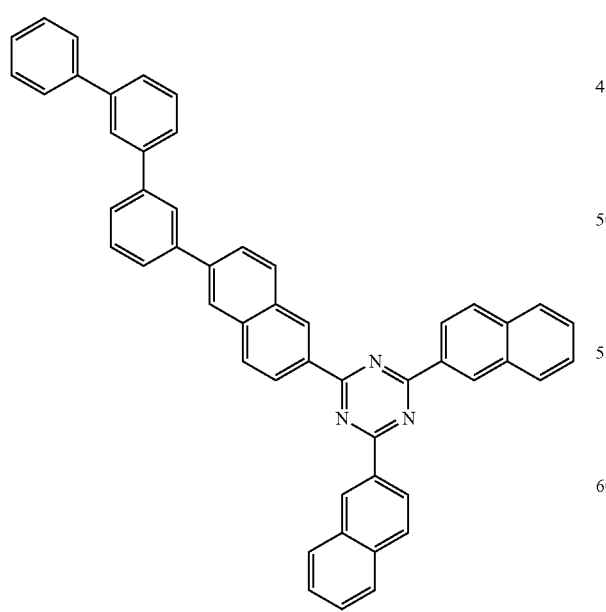
P-21
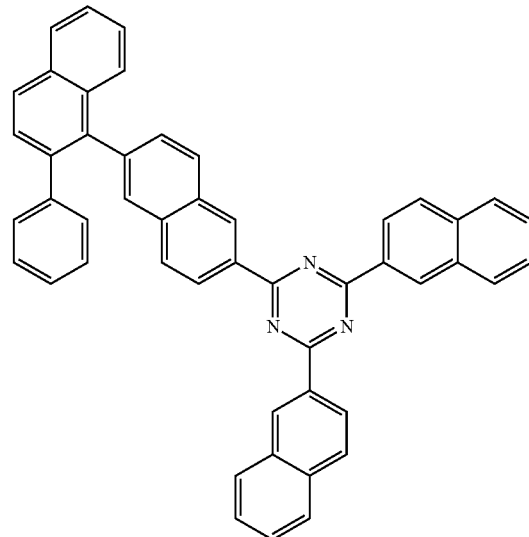
P-22
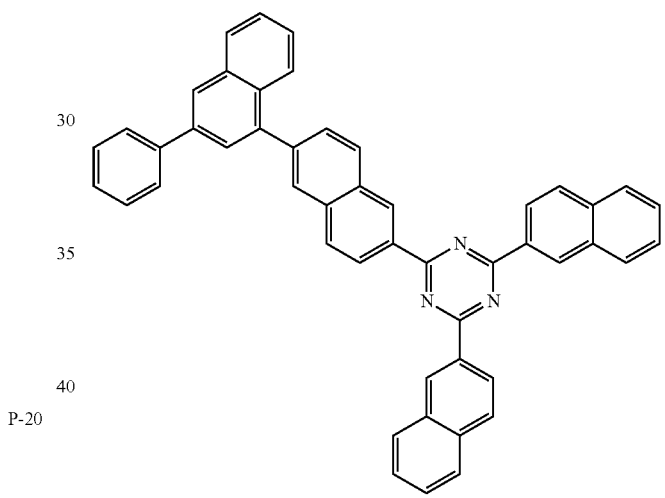
P-23

P-28
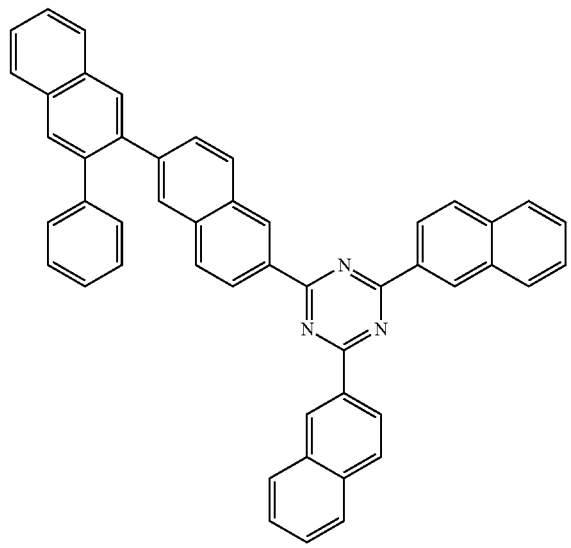
P-35
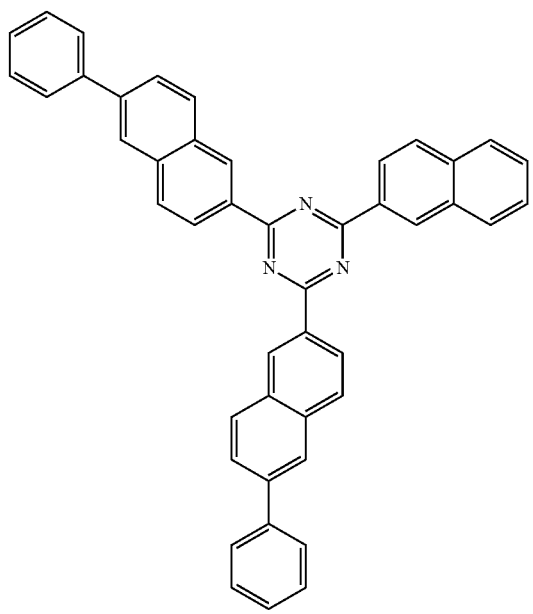
P-29
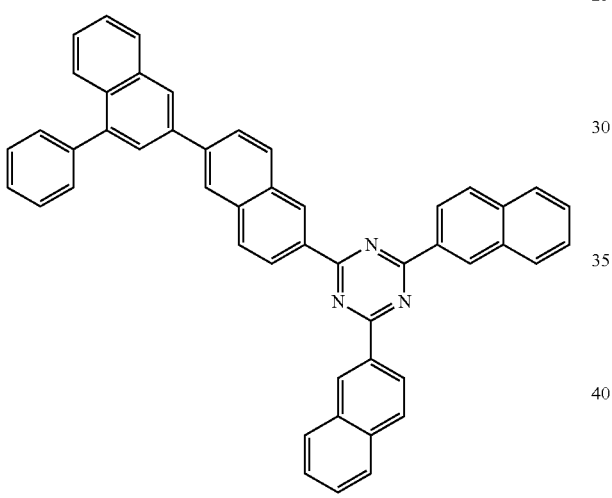
P-34
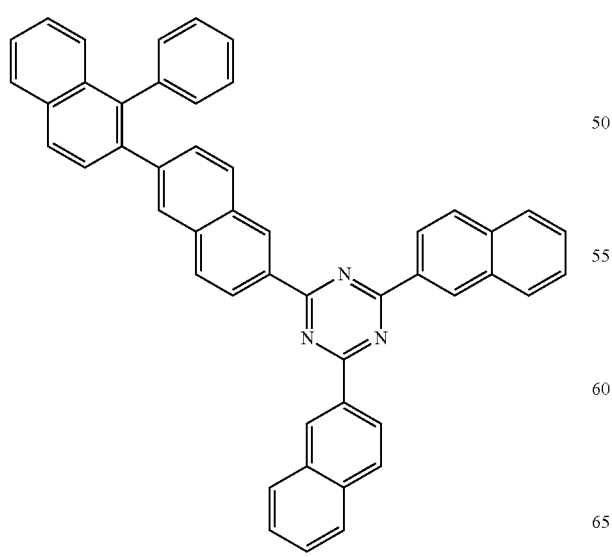
P-36
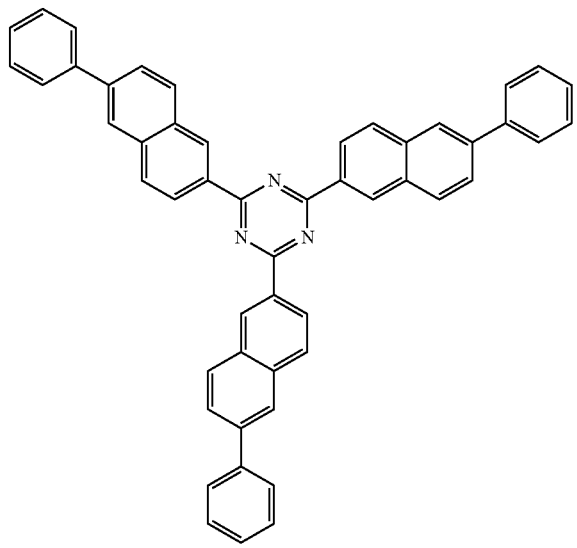

P-37
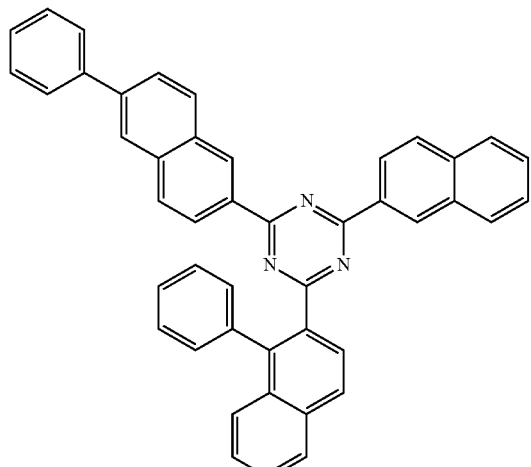
P-40
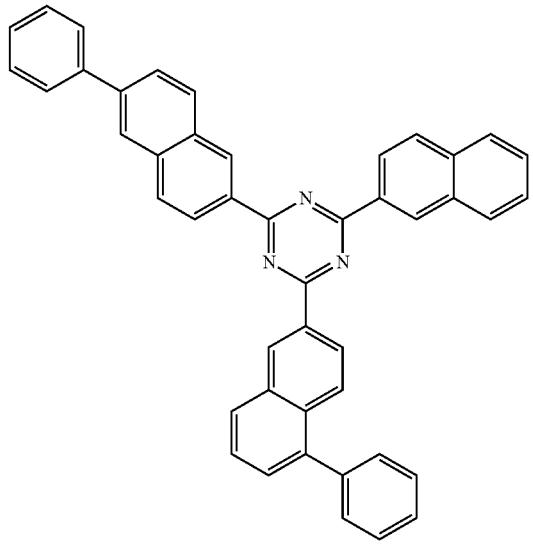
P-38
P-41
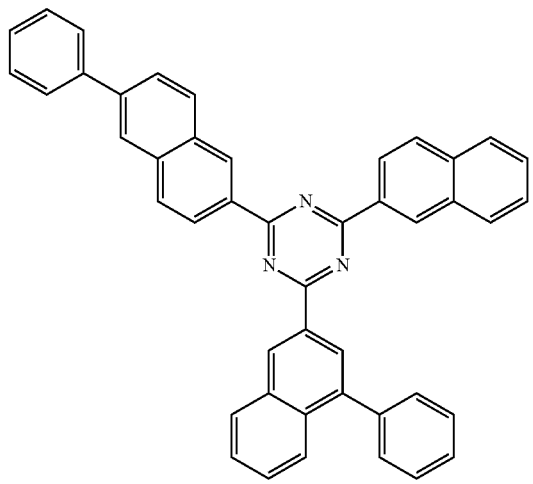
P-39
P-42
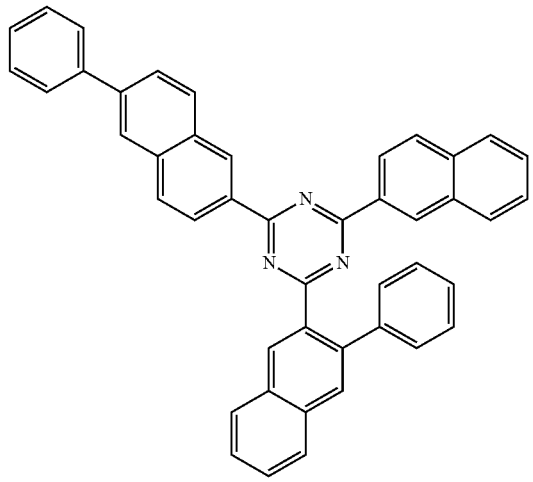

P-43

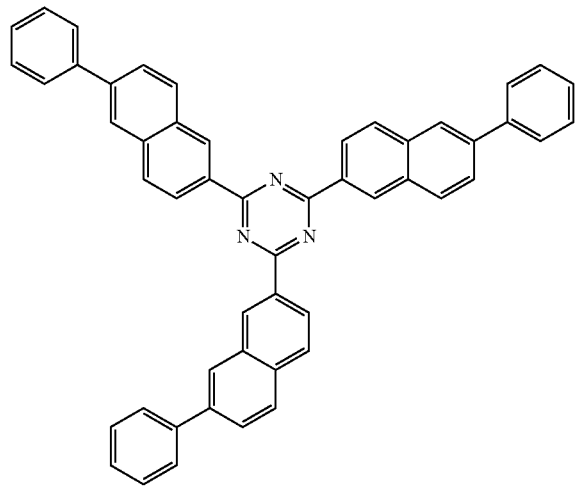

P-45

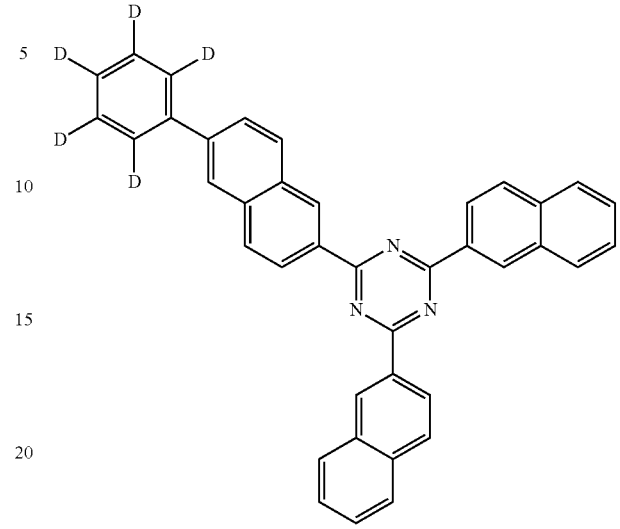

P-46

P-44

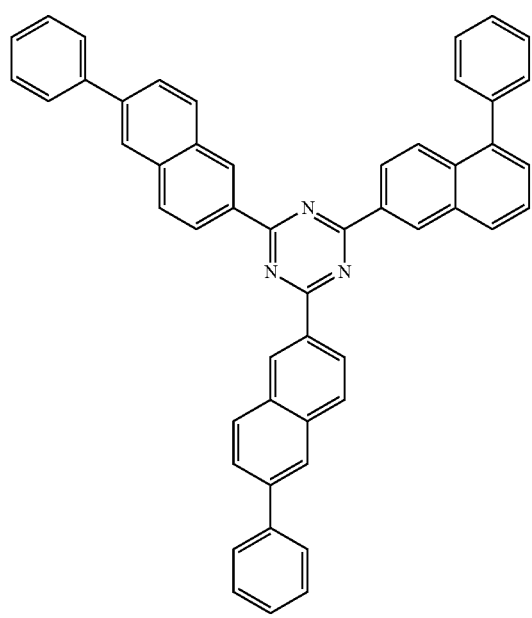

7. An organic electronic element comprising a first electrode, a second electrode, and an organic material layer formed between the first electrode and the second electrode, wherein the organic material layer comprises an emitting layer, a hole blocking layer, and an electron transport layer, wherein the emitting layer, the hole blocking layer, or the electron transport layer comprises a compound of Formula 1 in claim 1.

8. The organic electronic element of claim 7, wherein the emitting layer comprises the compound of Formula 1.

9. The organic electronic element of claim 7, wherein the emitting layer comprises a first host compound and a second host compound, and the first host compound or the second host compound comprises the compound of Formula 1.

10. The organic electronic element of claim 7, further comprising a light efficiency enhancing layer formed on at least one surface of the first electrode and/or the second electrode, the surface directing opposite to the organic material layer.

11. The organic electronic element of claim 7, wherein the organic material layer comprises 2 or more stacks which includes a hole transport layer, an emitting layer, and an electron transport layer sequentially formed on the first electrode.

12. The organic electronic element of claim 11, wherein the organic material layer further comprises a charge generating layer formed between the 2 or more stacks.

13. An electronic device comprising: a display device including the organic electronic element of claim 7; and a control unit for driving the display device.

14. The electronic device of claim 13, wherein the electronic device is any one of an organic electroluminescent device (OLED), an organic solar cell, an organic photoreceptor (OPC), an organic transistor (organic TFT), and an element for monochromic or white illumination.

* * * * *